United States Patent [19]
Miyoshi

[11] Patent Number: 5,699,951
[45] Date of Patent: Dec. 23, 1997

[54] WIRE BONDER AND A BONDING TOOL AND BONDING ARM

[75] Inventor: Hideaki Miyoshi, Tokyo, Japan

[73] Assignee: Kaijo Corporation, Tokyo, Japan

[21] Appl. No.: 577,157

[22] Filed: Dec. 22, 1995

[30] Foreign Application Priority Data

Dec. 28, 1994 [JP] Japan .................... 6-338361

[51] Int. Cl.⁶ ............................................ H01L 21/60
[52] U.S. Cl. .................. 228/4.5; 228/7; 228/55; 483/16
[58] Field of Search ................. 228/1.1, 4.5, 7, 228/55, 102, 180.5, 904; 483/4, 16, 58; 29/739

[56] References Cited

U.S. PATENT DOCUMENTS

| | | | |
|---|---|---|---|
| 4,870,743 | 10/1989 | Gilmore | 228/1.1 |
| 5,180,093 | 1/1993 | Stansbury et al. | 228/1.1 |
| 5,368,216 | 11/1994 | Sakakura et al. | 228/4.5 |

*Primary Examiner*—Samuel M. Heinrich
*Attorney, Agent, or Firm*—Sughrue, Mion, Zinn, Macpeak & Seas, PLLC

[57] ABSTRACT

The present invention discloses a wire bonder that does not require bonding tool replacement to be performed by an experienced worker, is not bothersome and can be completed in an extremely short time, while also enabling time management of the degree of wear of the bonding tool and so forth to be performed reliably, so as to realize improved work efficiency and yield, as well as being able to demonstrate various other effects. In addition, the present invention also discloses a bonding arm and bonding tool that contribute to the achieving of these effects. The above effects are obtained by adding a tool replacement device that removes a used bonding tool (capillary) installed in a bonding arm and installs a new bonding tool. In addition, the above effects are obtained with respect to the bonding arm and bonding tool by forming a tapered surface that guides their mutual insertion.

12 Claims, 18 Drawing Sheets

5,699,951

WIRE BONDER AND A BONDING TOOL AND BONDING ARM

BACKGROUND OF THE INVENTION

1. Field of the Invention

The present invention relates to a wire bonder that connects, for example, a first bonding point, in the form of a pad on an IC chip, and a second bonding point, in the form of an external lead formed on a lead frame on which said IC chip is attached, using a wire having electrical continuity in an assembly process of semiconductor devices. In addition, the present invention relates to a bonding arm and bonding tool to be equipped on said wire bonder.

2. Description of the Prior Art

In this type of wire bonder of the prior art, a lead frame, on which a plurality of IC chips are attached arranged in a row in the lengthwise direction, is treated as the object of bonding. When work is started, said lead frame is transported onto a bonding stage that is heated by a heater block and so forth. Moreover, the first IC chip is positioned at the bonding work position. In this state, bonding work related to said first IC chip is performed by a bonding device equipped on the bonder. After that time, the lead frame is moved by the amount of the layout pitch of the IC chip after which bonding work is performed on the following IC chip. This work is continued to repeated moving in sequence until bonding connections of all IC chips have been completed.

FIG. 1 indicates the essential portion of the bonding device provided on wire bonder of the prior art.

As shown in the drawing, said bonding device has a bonding arm, comprised of horn 1 and holding frame 2, and vibrator 3 coupled to the rear end of said horn 1. Said vibrator 3 generates ultrasonic vibrations of a prescribed frequency following the application of voltage of a prescribed frequency by an oscillator not shown. In addition, horn 1 demonstrates the action of mechanically amplifying the vibrations generated by said vibrator 3.

A capillary 5 in the form of bonding tool is attached to the end of horn 1. As is clear from FIGS. 2 and 3, this capillary 5 is formed into a hollow shape and wire 6 is inserted through it, and is for bonding ball 6a, formed by, for example, generating a spark on the end of said wire 6 with high voltage, to a pad (not shown) or lead (not shown) located at the bonding position. Furthermore, as shown with arrow U in FIG. 1, since the ultrasonic vibrations transmitted to horn 1 are longitudinal vibrations with respect to said horn, the axial center of capillary 5 is attached so that its axial center is perpendicular to the axial center of horn 1 in order to convert those vibrations into horizontal vibrations required for coupling of ball 6a and the bonding object.

The following provides a detailed description of the structure for attaching capillary 5 to horn 1.

As shown in FIGS. 2 and 3, capillary 5 is formed into the shape of a cylinder with the exception of its end. Capillary 5 is coupled and attached to horn 1 at this cylindrical portion. Corresponding to this, the portion where capillary 5 is coupled to horn 1 serves as insertion hole 1a, having a circular cross-section, in which said capillary 5 is inserted. Then Slit 1b is formed so as to cross the center of said insertion hole 1a in the axial direction of horn 1, and capillary 5 is mounted by fastening both sites 1c and 1d divided by said slit 1b by bolt 7.

In the case of performing bonding in the above-mentioned constitution, a bonding arm comprised of horn 1 and holding frame 2 is operated in the downward direction (direction perpendicular to the paper in FIG. 1) by an arm driving device not shown in the state in which a lead frame (not shown) is heated on a bonding stage (not shown). Consequently, capillary 5 makes contact with a pad or lead in the form of a bonding site, and ball 6a formed on the end of wire 6 inserted into said capillary 5 is pressed and bonded by said pad or lead. Simultaneous to this bonding, capillary 5 is vibrated to complete bonding by the actions of heat and ultrasonic vibrations.

In the above-mentioned wire bonder, the end of capillary 5 demonstrates violent frictional action based on the ultrasonic vibrations applied to it and the pressing force during bonding of the above-mentioned ball 6a. Thus, despite being formed from materials having a high degree of wear resistance such as ceramics, rubies and so forth, that wear cannot be completely prevented. In addition, since clogging of the wire through hole provided in capillary 5 tends to occur easily in combination with wear, these parts must replaced with new parts as the occasion demands in order to maintain a favorable bonding state.

As a specific example of this, as shown in FIG. 4, a worker holds a torque wrench 10, fits the end of hexagonal chip 10a equipped on said torque wrench into the hexagonal socket in the head of bolt 7 (with hexagonal socket), and then loosens said bolt 7. He then takes out the used capillary 5 from horn 1 using a tweezers and so forth. Next, the new capillary 5 is inserted into horn 1. At this time, since the attachment position of capillary 5 with respect to horn 1 is important in consideration of performing highly precise bonding work, the position of capillary 5 with respect to horn 1 is set by using jig 11, having engaging surfaces 11a and 11b that respectively engage with the lower end of horn 1 and end of capillary 5. In this state, bolt 7 is then tightened using torque wrench 10 to complete capillary replacement.

This type of replacement work takes a relatively long time even if performed by an experienced worker since capillary 5 itself is a considerably small part and so forth. Together with this being a problem that should be solved in order to improve the efficiency of bonding work, it is also bothersome for workers. In addition, since the degree of wear of capillary 5 is proportional to the cumulative amount of time of continuously performed bonding work, in order to obtain a favorable bonding state, the amount of time at which the allowed degree of wear is exceeded is determined based on test work and so forth performed in advance, a prescribed amount of time prior to the reaching of that time is set, and replacement work is performed whenever that prescribed amount of time elapses. However, there are cases in which the passage of this prescribed time itself is overlooked, resulting in the occurrence of defective bonding and decreased yield.

SUMMARY OF THE INVENTION

In consideration of the above-mentioned problems, the object of the present invention is to provide a wire bonder that does not require bonding tool replacement to be performed by an experienced worker, is not bothersome and can be completed in an extremely short time, while also enabling time management of the degree of wear of the bonding tool and so forth to be performed reliably to realize improved work efficiency and yield, as well as being able to demonstrate various other effects. In addition, another object of the present invention is to provide a bonding arm and bonding tool that contributes to the attainment of the above effects.

In order to achieve the above-mentioned effects, the present invention provides a wire bonder comprising: positioning a bonding tool at a location corresponding to the bonding site of the bonding object by two-dimensionally moving a bonding arm on which bonding tool is mounted by a positioning device; and, bringing said bonding tool close to said bonding site by operating said bonding arm by an arm driving device; wherein, a tool replacement device is provided that together with maintaining a stock of a plurality of new bonding tools and removing bonding tool mounted on said bonding arm, also installs said new bonding tool.

In addition, the bonding arm according to the present invention is such that the portion that is coupled to the bonding tool to be installed acts as an insertion hole into which said bonding tool is inserted, and a tapered surface for guiding the insertion of said bonding tool is formed in the opening on the side of tool insertion hole on which said insertion hole is inserted.

In addition, the bonding tool according to the present invention is such that a tapered surface that guides its insertion is formed on the end of the side that is inserted into the insertion hole formed in said bonding arm.

In the wire bonder of the above-mentioned constitution, the tool replacement device operates when the operation of the bonding arm has stopped, the used bonding tool mounted on said bonding arm is removed, and a new bonding tool is installed.

In addition, in the bonding arm of the above-mentioned constitution, when a bonding tool is inserted into the insertion hole of said bonding arm, said bonding tool is guided smoothly and reliably by the above-mentioned tapered surface.

In addition, in the bonding tool of the above-mentioned constitution, when said bonding tool is inserted into the insertion hole formed in a bonding arm, said bonding tool is guided smoothly and reliably by the above-mentioned tapered surface.

DESCRIPTION OF THE PREFERRED EMBODIMENTS

The following provides an explanation of the preferred embodiments of the wire bonder of the present invention with reference to the attached drawings.

Figure 1:
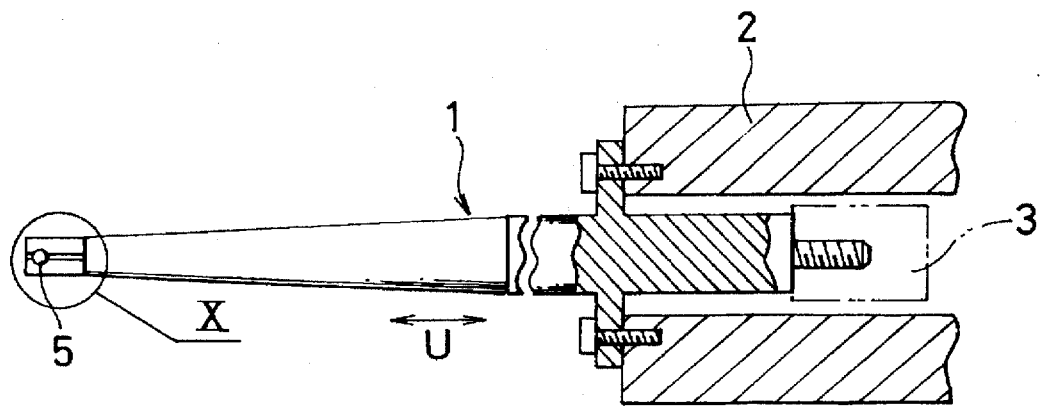
FIG. 1 is an overhead view, including a partial cross-section, of the essential portion of a wire bonder of the prior art.
Figure 2:
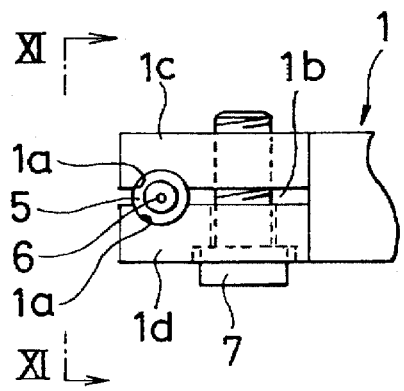
FIG. 2 is an enlarged view of portion X in FIG. 1.
Figure 3:
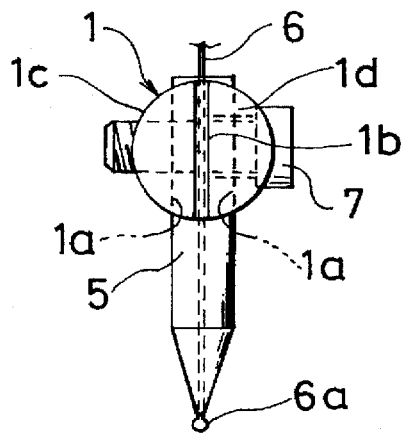
FIG. 3 is a view taken along arrows XI—XI relating to FIG. 2.
Figure 4:
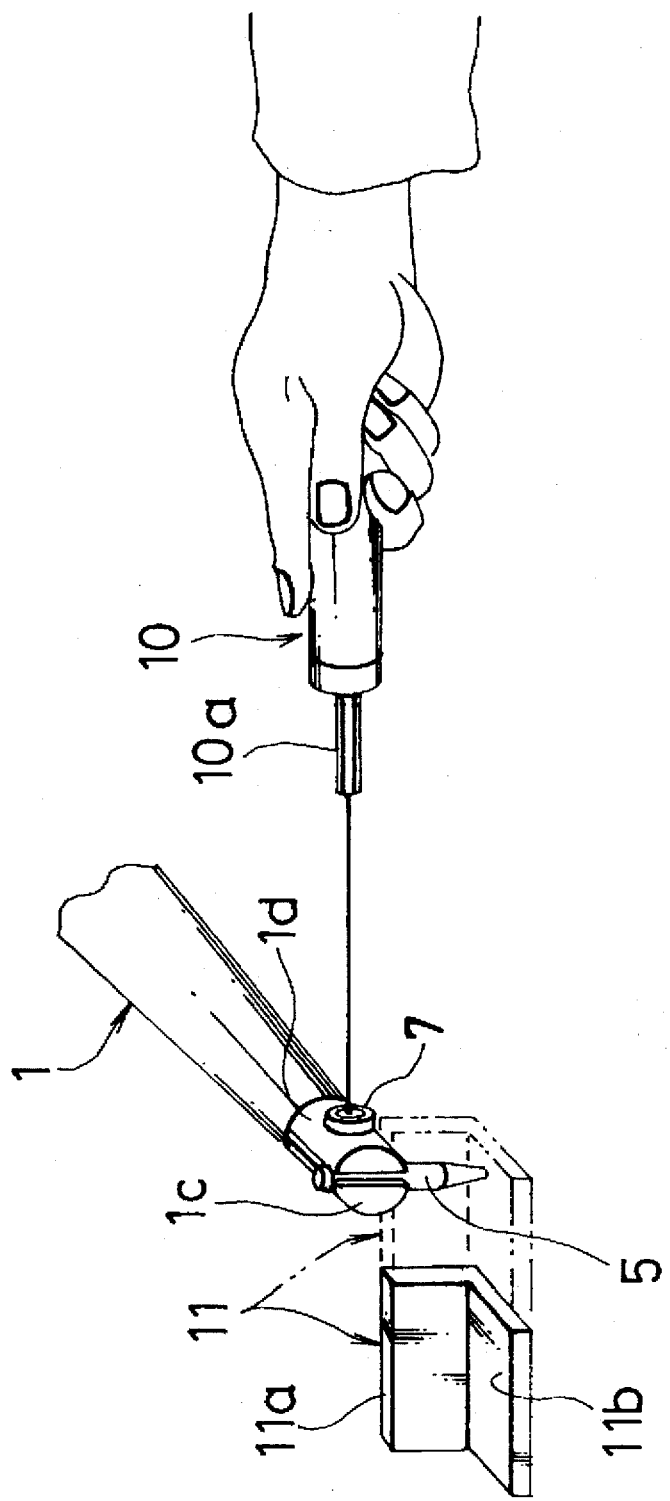
FIG. 4 is a perspective view showing the state when capillary replacement is performed with respect to the constitution shown in FIGS. 1 through 3.
Figure 5:
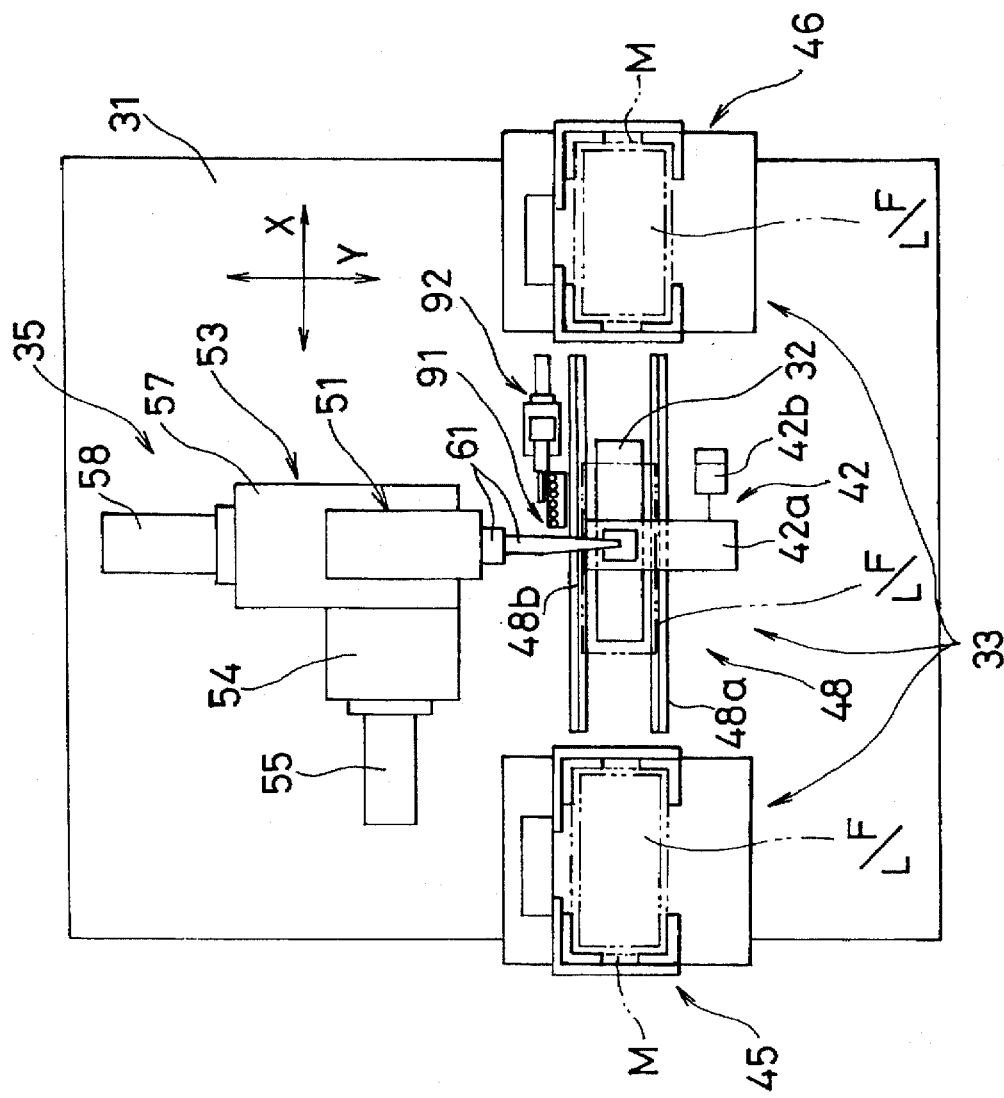
FIG. 5 is an overhead view of a wire bonder as claimed in the present invention.

FIG. 5 is an overhead view of a wire bonder as claimed in the present invention. As shown in the drawing, said wipe bonder is equipped with bonding stage 32 on its frame 31, frame supply and collection device 33 and bonding device 35.

Figure 6:
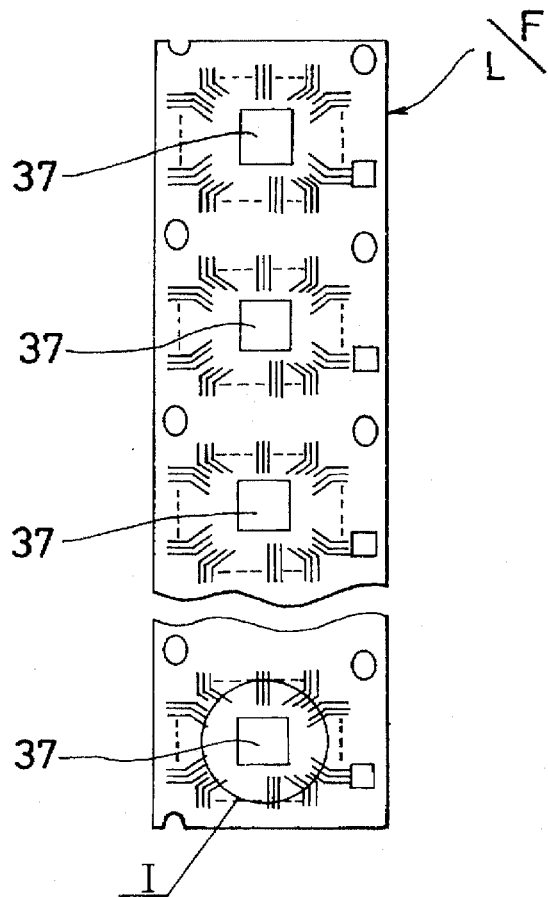
FIG. 6 is an overhead view of a lead frame to be treated as the bonding object in the wire bonder shown in FIG. 5.
Figure 7:
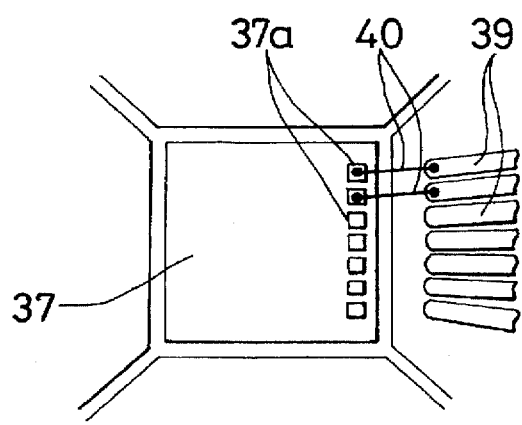
FIG. 7 is an enlarged view of portion I in FIG. 6.

In said wire bonder, lead frame L/F shown in FIG. 6 is treated as the bonding object. As shown in the drawing, a plurality of IC chips 37 are mounted at equal pitch on this lead frame L/F in its lengthwise direction. As shown in FIG. 7, said wire bonder performs bonding using wire 40, made of a conductive material such as gold or aluminum, between lead 39 formed on said lead frame L/F and pad 37a on IC chip 37.

The above-mentioned bonding stage 32 is for performing the above-mentioned bonding work using it as a stage, and holds the portion at which the IC chip on which bonding is to be performed and a plurality of IC chips are in front and in back of it are mounted, which accounts for a portion of the entire length of the above-mentioned lead frame L/F. In addition, a heating device (not shown), such as a heater block and so forth, which heats lead frame L/F to a prescribed temperature is additionally provided on said bonding stage 32.

As shown in FIG. 5, a pushing device 42 is provided in the vicinity of the above-mentioned bonding stage 32 for pushing the bonding site of lead frame L/F towards said bonding stage 32 during the above-mentioned bonding work and fixing it in position. As shown in the drawing, this pushing device 42 is provided so as to oscillate freely in the vertical direction (direction perpendicular to the paper in FIG. 5), and is composed of pushing plate 42a that pushes lead frame L/F with its free end, and a plate driving device (not shown except for motor 42b) that contains motor 42b and drives said pushing plate 42a.

Next, the following provides an explanation of the frame supply and collection device 33 shown in FIG. 5.

As shown in the drawing, said frame supply and collection device 33 has loader 45, into which is loaded magazine M in which a plurality of unbonded lead frames L/F are arranged and contained (arranged in the vertical direction perpendicular to the paper), and unloader 46, into which is loaded empty magazine M to as to receive lead frames L/F on which bonding work has been performed by bonding device 35 and in which said lead frames L/F are arranged and contained (arranged in the vertical direction perpendicular to the paper). Although not shown in the drawing, a transport device is provided that together with carrying in lead frames L/F inside magazine M on said loader 45 one at a time onto bonding stage 32 to supply for bonding work, carries out lead frames L/F on which bonding has been completed to as to be contained in magazine M on unloader 46. Moreover, guiding mechanism 48 is provided that guides lead frames L/F that are carried by said transport device. As shown in the drawings said guiding mechanism 48 has two guide rails 48a and 48b, and lead frames L/F are guided by making sliding contact and being held with both sides of both of said guide rails.

Furthermore, together with the above-mentioned loader 45 positioning said magazine M with high precision so that lead frames L/F within magazine M that is loaded in it are guided smoothly between the above-mentioned guide rails 48a and 48b, it also raises or lowers said magazine M so that the plurality of lead frames L/F arranged and contained in said magazine M are aligned in order one at a time at the guiding level of both of the above-mentioned guide rails 48a and 48b. In addition, unloader 48 has similar function as that of said loader 45.

Continuing, the following provides an explanation of the above-mentioned bonding device 45.

As shown in FIG. 5, bonding device 35 has bonding head 51, and a positioning device in the form of XY driving mechanism 53 on which said bonding head 51 is loaded, and which positions said bonding head 51 by suitably moving it two-dimensionally, and in this case within the horizontal plane. As shown in the drawing, this XY driving mechanism 53 is composed of X table 54, which is provided so as to be able to freely reciprocate in the X direction on frame 31, motor 55 that drives said X table 54, Y table 57, which is provided so as to be able to freely reciprocate in the Y direction perpendicular to said X direction on said X table 54 and which holds the above-mentioned bonding head 51, and motor 58 that drives said Y table 57.

The following provides a detailed description of the above-mentioned bonding head 51.

Figure 8:
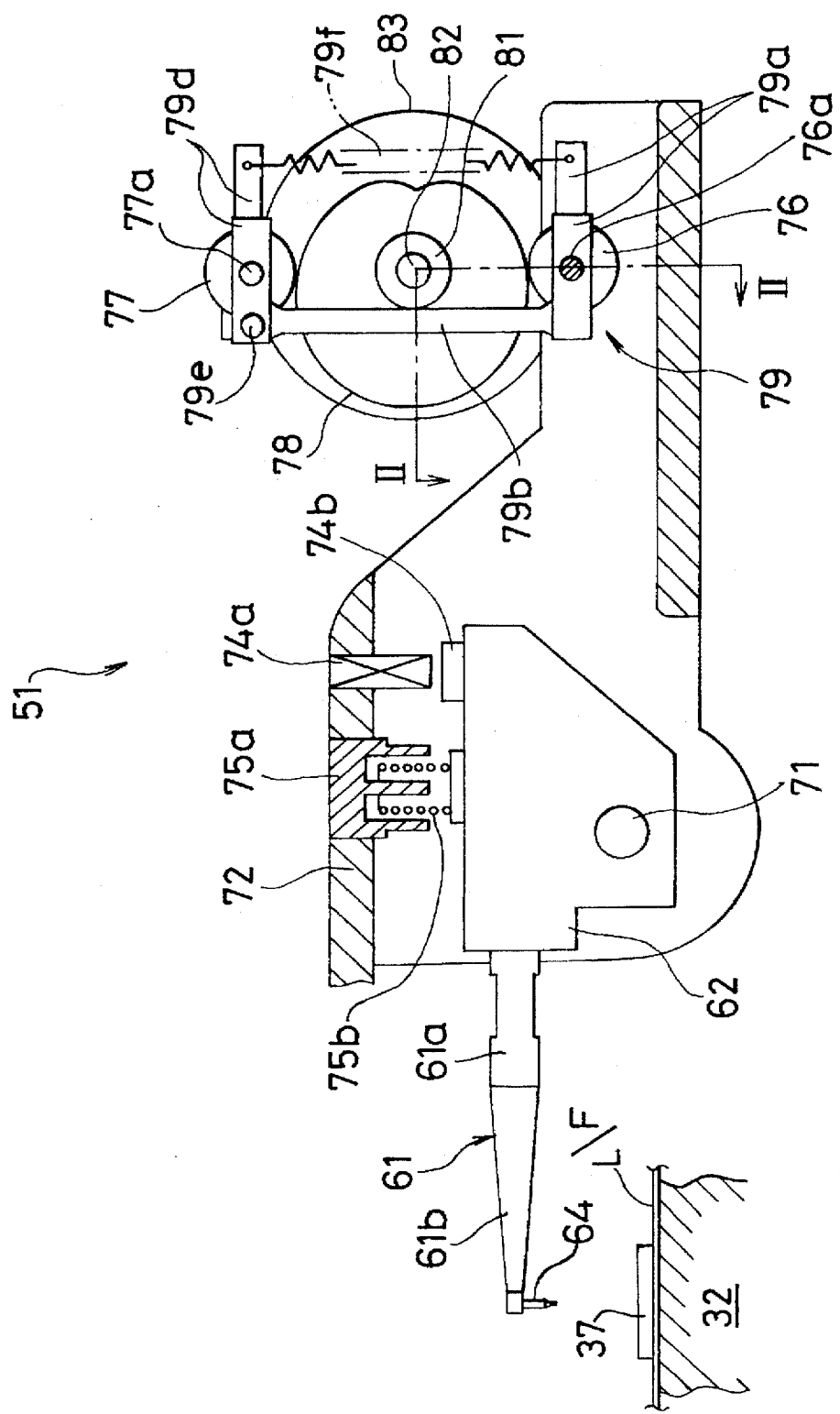
FIG. 8 is a side view, including a partial cross-section, of the bonding head equipped on the wire bonder shown in FIG. 5.

As shown in FIG. 8, said bonding head 51 has horn 61 and holding frame 62, which supports said horn 61 and composes a bonding arm with said horn. Said holding frame 62 is fit onto rotatable support shaft 71. In addition, oscillating arm 72 is fit onto said support shaft 71 so as to oscillate freely. Solenoid 74a and electromagnetic adsorption piece 74b are mounted in mutual correspondence on said oscillating arm 72 and holding frame 62, respectively. When holding frame 62 is oscillated, power is applied to solenoid 74a, and due to the generation of adsorption force between solenoid 74a and electromagnetic adsorption piece 74b, said holding frame 62 and oscillating arm 72 enter a mutually fixed state. Magnet 75a and coils 75b are attached to oscillating arm 72 and holding frame 62, respectively, at locations to the front of the above-mentioned electromagnetic adsorption device. These magnet 75a and coils 75b compose a device that generates adsorption force for applying force in the downward direction in FIG. 8 to the site which holds the end of horn 61, namely the bonding tool in the form of capillary 64, during bonding.

Figure 9:
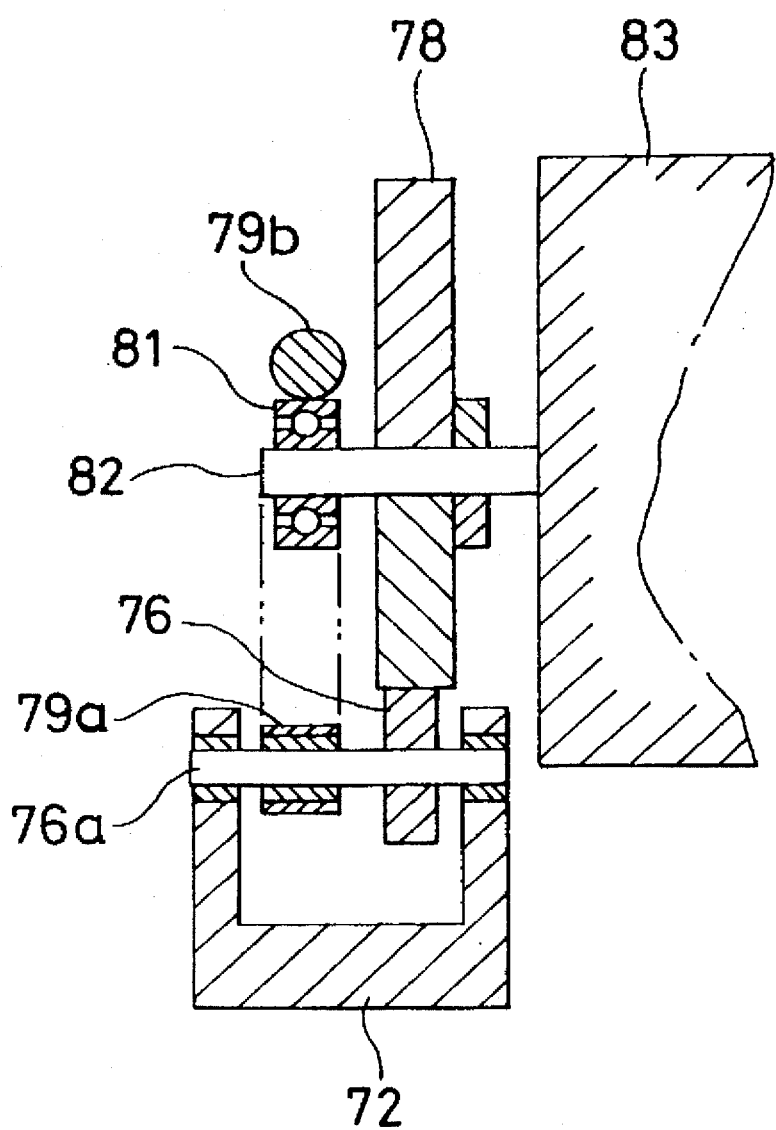
FIG. 9 is a cross-sectional view II—II relating to FIG. 8.

As shown in FIG. 9, support shaft 76a is embedded in the rear end of oscillating arm 72, and arm side cam follower 76 and oscillating base 79a are able to rotate freely around this support shaft 76a. Bearing guide 79b is mounted on the lower end of oscillating base 79a, and preload arm 79d is attached to rotate freely on the upper end of this bearing guide 79b by means of support pin 79e. Support shaft 77a is provided on the free end of preload arm 79d, and cam follower 77 is attached to rotate freely on said support shaft 77a. A tension spring in the form of preload spring 79f is attached between the end of preload arm 79d and the end of oscillating base 79a, and arm side cam follower 76 and cam follower 77 are pressed against the cam surface in the form of the outer edge of cam 78 formed roughly into the shape of a heart. Furthermore, the two contact points that arm side cam follower 76 and cam follower 77 make with cam 78 are located on both sides of the center of rotation of cam 78.

A frame structure is formed by the above-mentioned oscillating base 79a, bearing guide 79b and preload arm 79d, and this is generically referred to as oscillating frame 79. Bearing guide 79b, a composite member of said oscillating frame 79, makes contact with the outer ring of radial bearing 81 attached to cam shaft 82 onto which cam 78 is fit. Furthermore, cam 78 rotates by torque applied to cam shaft 82 by motor 83. The bonding arm, composed of horn 61 and holding frame 62, oscillates integrally with oscillating arm 72 by the rotation of this cam 78, and as a result, capillary 64 approaches and moves away from the bonding site of the bonding object in the form of lead frame L/F. The arm driving device for operating said bonding arm so that capillary 64 approaches and moves away from the bonding site of lead frame L/F is composed in this manner.

Next, the following provides a detailed description of the above-mentioned horn 61 and its peripheral constitution.

Figure 10:
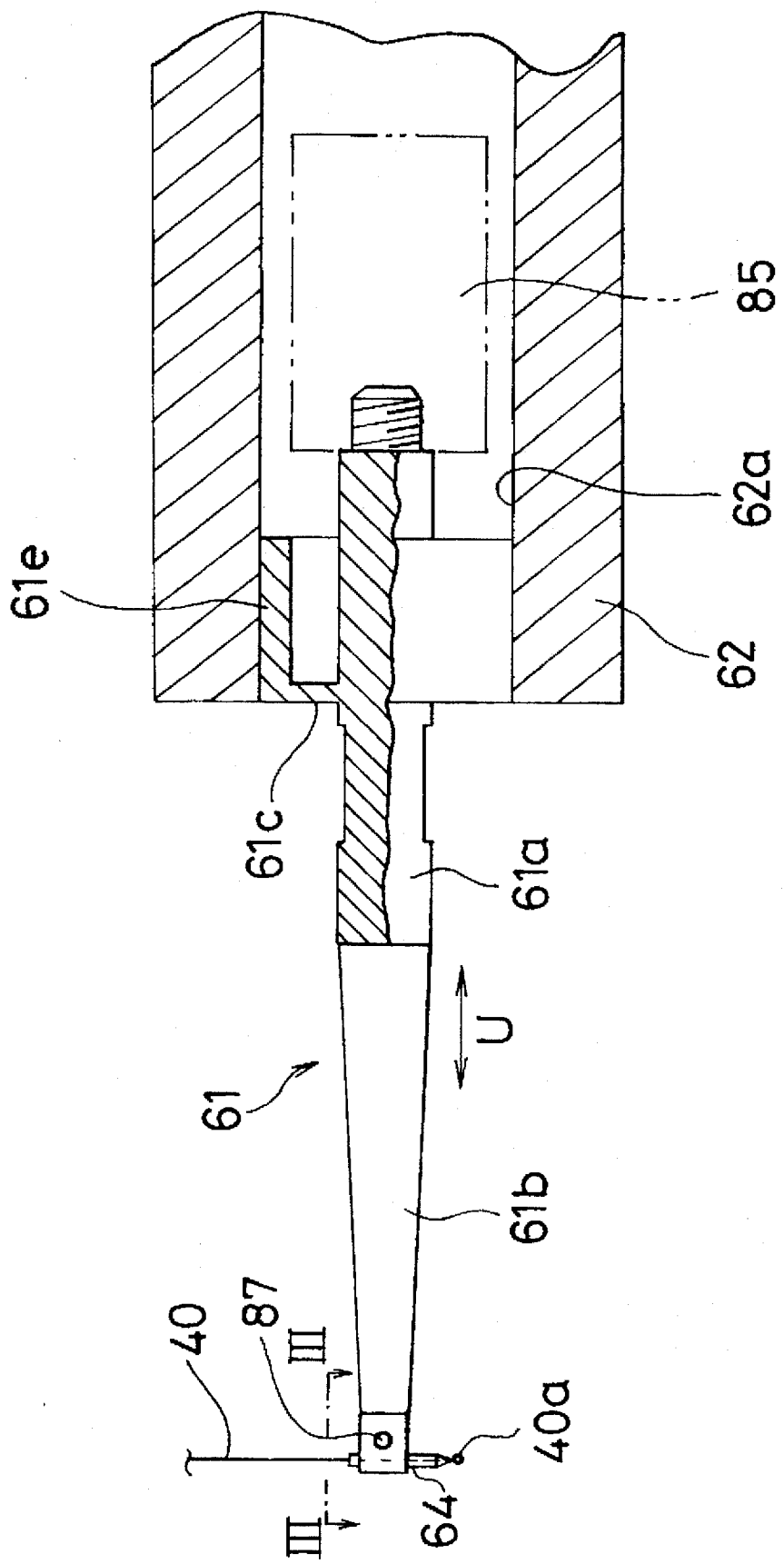
FIG. 10 is a longitudinal cross-sectional view of a portion of the bonding head shown in FIG. 8.

As shown in FIG. 10, fitting portion 61e, which fits into insertion hole 62a formed in holding frame 62 which holds horn 61, is provided neap the rear end of said horn 61. This fitting portion 61e is roughly in the shape of a cylinder, and is formed into a single unit with flange portion 61c provided at the nodal point (location of the node of ultrasonic vibrations) of horn 61.

Vibrator 85 is coupled to the Fear end of horn 61. Said vibrator 85 produces ultrasonic vibrations of a prescribed frequency when voltage of said prescribed frequency is applied by an oscillator not shown. This vibrator 85 and oscillator are generically referred to as an ultrasonic vibrating device. Horn 61 has straight horn portion 61a, on the rear end of which is mounted said vibrator 85, and conical horn portion 61b, which amplifies the amplitude of ultrasonic vibrations transmitted through said straight horn portion 61a from said vibrator 85, and transmits them to capillary 64 on its end. Capillary 64 is then excited as a result of said transmission of vibrations.

Furthermore, horn 61 is formed from a material such as stainless steel (SUS), titanium (Ti) or their alloy steel and so forth.

On the other hand, ceramics or rubies and so forth are selected for the material of the bonding tool in the form of capillary 64 attached to the end of horn 61, and said capillary 64 is formed into a hollow shape. As shown in FIG. 10, wire 40 is inserted from above into said hollow portion, and ball 40a, which is formed by generating a spark and so forth with high voltage on the end of said wire 40, is bonded to the bonding site of the bonding object in the form of lead frame L/F, namely to pad 37a (see FIG. 7) or lead 39 (see FIG. 7) of IC chip 37. Furthermore, as is shown with arrow U in FIG. 10, since ultrasonic vibrations transmitted to horn 61 from vibrator 85 are longitudinal vibrations with respect to said horn 61, the axial center of capillary 64 is mounted perpendicular to the axial center of horn 61 so that vibrations are converted into horizontal vibrations necessary for the coupling between ball 40a of the above-mentioned wire 40 and the pad and so forth.

Continuing, the following provides a detailed description of the structure for attaching capillary 64 to horn 61.

Figure 11:
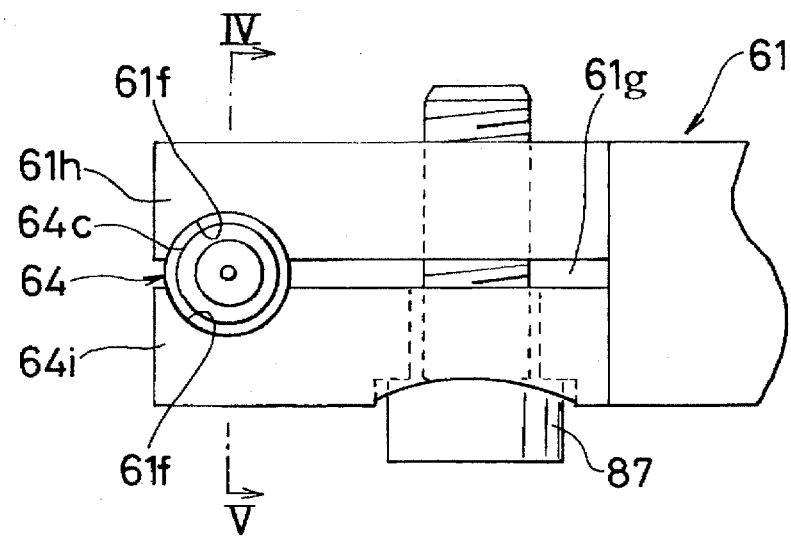
FIG. 11 is a view taken along arrows III—III relating to FIG. 10.
Figure 12:
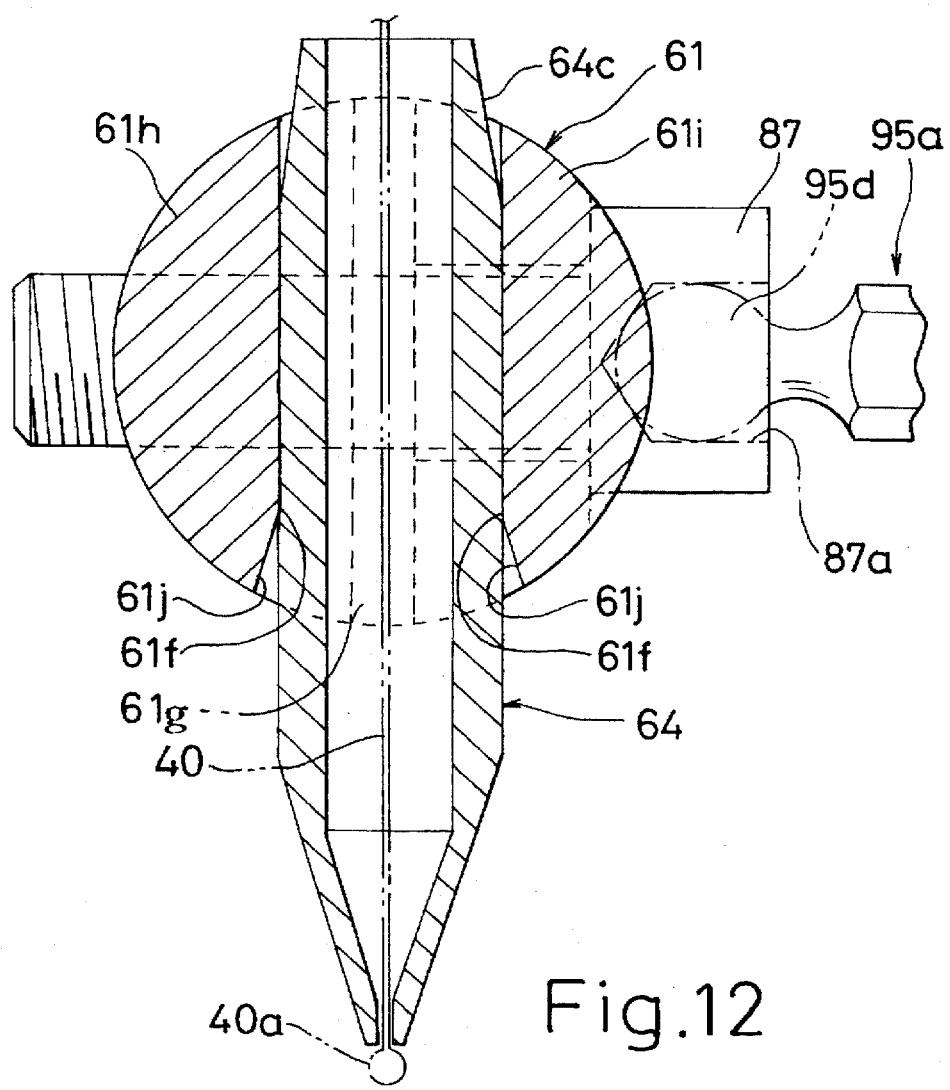
FIG. 12 is a cross-sectional view IV—IV relating to FIG. 11.

As is clear from FIGS. 11 and 12, the end of capillary 64 is formed roughly into the shape of a cone, while the other portion is formed into the shape of a cylinder. This cylindrical portion is attached to horn 61 as the coupling portion. Corresponding to this, the coupling portion between horn 61 and capillary 64 serves as insertion hole 61f, having a roughly circular cross-section, into which said capillary 64 is inserted. Slit 61g is formed so as to cross through the center of said insertion hole 61f in the axial direction of horn 61, and capillary 64 is fastened by fastening both sites 61h and 61i, which are divided by said slit 61g, by a fastening member in the form of bolt 87 (with hexagonal socket). Furthermore, said bolt 87 and the female threaded portion (not indicated with a reference numeral), formed in horn 61 into which said bolt is screwed, are generically referred to as a fastening device.

However, said wire bonder is provided with a function that automatically removes capillary 64 that has been used for a period of time after having been installed in the above-mentioned horn 61, and installs a new, unused capillary in said horn 61. The following provides an explanation of a tool replacement device that performs this replacement work.

As shown in FIG. 5, tool holding device 91 and fastening member tightening and removal device 92, which are contained in said tool replacement device, are provided on frame 31 of the apparatus, close to bonding device 35, and in this case, between said bonding device 35 and guiding mechanism 48. Said tool holding device 91 is for stocking a plurality of new capillaries to be used for replacement, and is arranged within the range of two-dimensional movement of the bonding arm that includes above-mentioned horn 61. In addition, fastening member tightening and removal device 92 performs tightening and removal of a fastening member in the form of bolt 87 that screws into the above-mentioned horn 61 for the purpose of capillary fastening, and is provided near said tool holding device 91. The following provides individual explanations of this tool holding device 91 and fastening member tightening and removal device 92.

Figure 13:
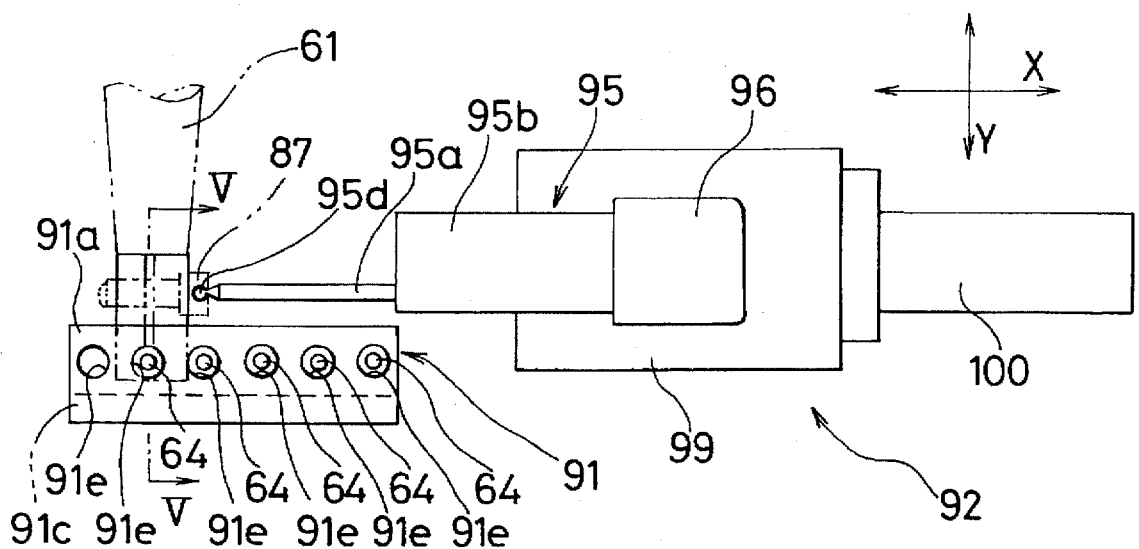
FIG. 13 is an overhead view of the tool retaining device and fastening member tightening and removal device equipped on the wire bonder shown in FIG. 5.
Figure 14:
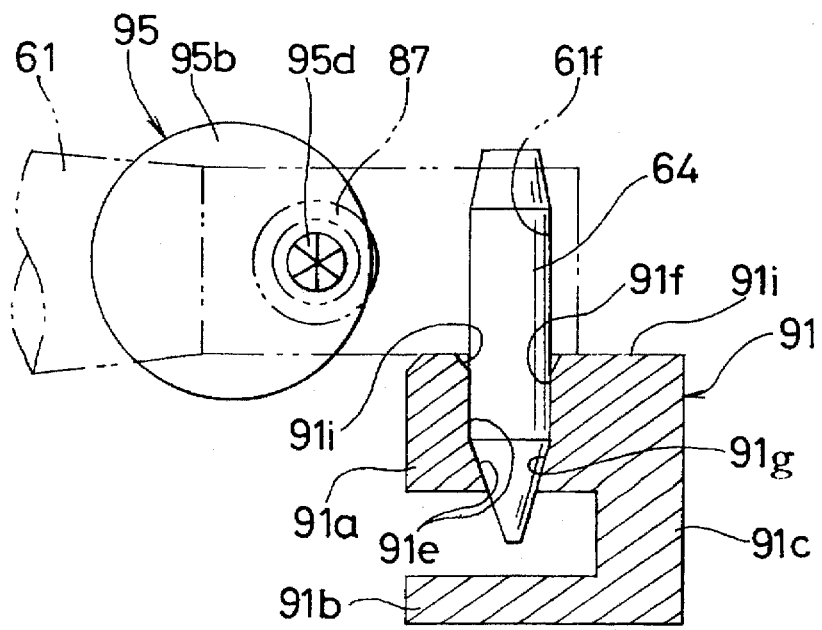
FIG. 14 is a view taken along arrows V—V relating to FIG. 13.

First, with respect to tool holding device 91, as shown in FIGS. 13 and 14, tool holding device 91 is a rectangular box, and has upper portion 91a and lower portion 91b, mutually separated above and below and extending horizontally, and side portion 91c juxtapositioned vertically to mutually link said upper portion 91a and lower portion 91b. These portions are preferably formed into a single unit overall. As is clear from FIGS. 5 and 13, this tool holding device 91 is arranged so that its lengthwise direction coincides with the X direction, namely the direction of movement of X table 54 equipped on previously mentioned XY driving mechanism 53, and mounted to frame 31 of the apparatus at the above-mentioned lower portion 91b. Tool holding device holds a plurality, and in this case five, of unused capillaries 64 so as to be mutually parallel in the vertical direction, which is the direction of approach and moving away of capillary 64, with respect to lead frame L/F based on oscillation of the above-mentioned bonding arm, and arranged in a row in said lengthwise direction. More specifically, insertion holes 91e, into which each of said capillaries 64 is inserted, are provided in a row in upper portion 91a of said tool holding device 91, and each of said insertion hole 91e serves as a holding portion that holds capillaries 64. More specifically, as is clear from FIG. 14, said insertion holes 91e pass vertically through the above-mentioned upper portion 91a, and roughly the upper half is in the form of hole 91f, having roughly the same diameter as the cylindrical portion of capillary 64, while roughly the lower half is in the form of tapered surface 91g, which gradually becomes narrower in the downward direction. Capillary 64 is supported and held by this tapered surface 91g at its end portion formed into roughly a conical shape. Furthermore, as is clear from FIG. 13, the number of said insertion holes 91e is one more than the number of capillaries 64 to be held, with one of those holes being empty in which capillary 64 is not inserted.

On the other hand, the fastening member tightening and removal device 92 arranged near the above-mentioned tool holding device 91 is composed in the manner described below.

As shown in FIGS. 13 and 14, said fastening member tightening and removal device 92 has a torque wrench 95 in the form of tool for tightening and removing a bolt 87 in the form of fastening member by engaging with said bolt 87, a motor 96 in the form of tool driving device that operates said torque wrench 95 by applying driving force to it so as to perform tightening and removal with said torque wrench, and an uniaxial driving mechanism 97 in the form of movement device that holds said torque wrench 95 and motor 96 and moves between the positions where said torque wrench 95 engages and separates from the above-mentioned bolt.

Figure 15:
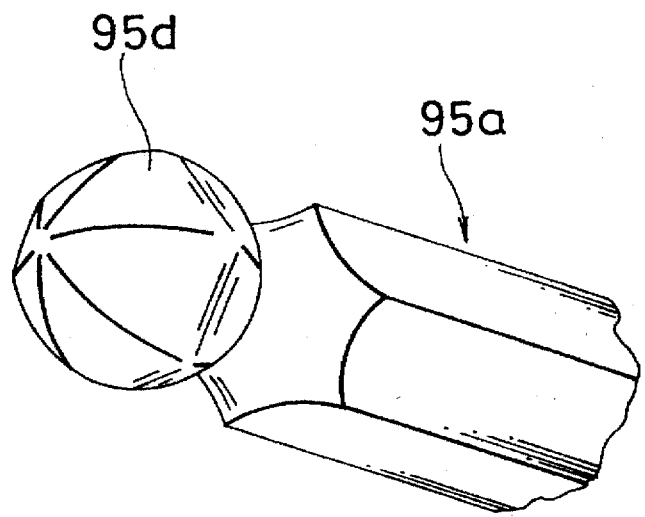
FIG. 15 is a perspective view of the end of a hexagonal chip that is a composite member of the fastening member tightening and removal device shown in FIG. 13.
Figure 16:
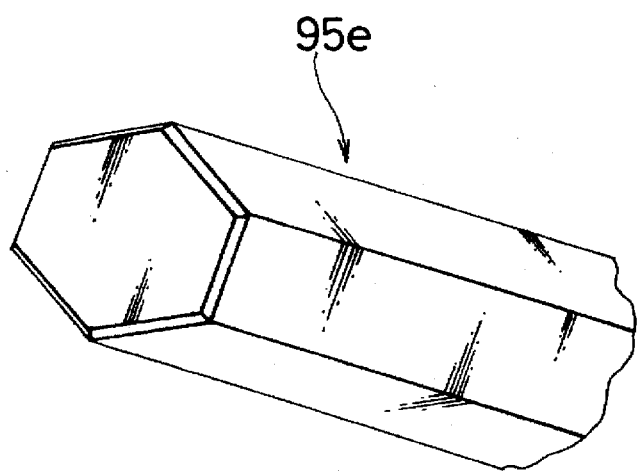
FIG. 16 is a perspective view showing the end of a variation of the hexagonal chip to be equipped on the fastening member tightening and removal device shown in FIG. 13.

More specifically, as shown in FIGS. 12 through 14, the above-mentioned torque wrench 95 has hexagonal tip 95a, which engages at its end with hexagonal socket 87a (see FIG. 12) formed in the head of the above-mentioned bolt 87 (with hexagon socket), and a torque setting portion 95b in the form of fastening force setting device for setting fastening force at a constant level. Furthermore, as a result of providing said fastening force setting device, the fastened force of capillary 64 that is sequentially replaced also remains constant, thus resulting in the transmission efficiency of ultrasonic vibrations applied by the previously described ultrasonic vibrating device being uniform regardless of which capillary is used, thus enabling bonding using ultrasonic energy to be performed reliably at all times without the occurrence of bonding defects. In addition, as is also shown in FIG. 15, fitting portion 95d with bolt 87 provided on the end of said hexagonal tip 95a is in the shape of a ball. Consequently, fitting of bolt 87 into hexagonal socket 87a is performed smoothly. However, it goes without saying that hexagonal tip 95e, having the same cross-sectional shape over its entire length as shown in FIG. 16, may also be used instead of this ball shape. In addition, in the case the fastening member used for fastening is not a bolt with hexagon socket as in the present embodiment, it goes without saying that the shape of the tip may be suitably selected accordingly.

The movement device in the form of uniaxial driving mechanism 97, on which is loaded motor 96 together with torque wrench 95 having the above-mentioned constitution, is composed in the manner described below.

As shown in FIGS. 5 and 13, this uniaxial driving mechanism 97 is composed of moving table 99, which is provided so as to reciprocate freely in the previously described X direction on frame 31 of the apparatus, and holds the above-mentioned torque wrench 95 and motor 96, and motor 100, which drives said moving table 99.

Fastening member tightening and removal device 92 is composed in the manner described above. Since the constitution of this type of fastening member tightening and removal device 92 is relatively simple, in addition to costs being able to be held to a low level, since only a small amount of space is occupied, it can be easily incorporated without said wire bonder changing the layout positions and so forth of the various mechanisms already provided for bonding work.

The tool holding device 91 and fastening member tightening and removal device 92 of the above-mentioned constitutions compose a portion of a tool replacement device that replaces used capillaries with new capillaries. Namely, in said wire bonder, capillary replacement work is performed by XY driving mechanism 53 in the form of positioning device (see FIG. 5), which positions the bonding arm, and the previously mentioned arm driving device, which oscillates said bonding arm, functioning in cooperation with this tool holding device 91 and fastening member tightening and removal device 92. Furthermore, although this will be described in more detail later, the containment of used capillaries 64 for the above-mentioned tool holding device 91 and the coupling of new capillaries 64 to the bonding arm (equipped with horn 61) is performed by means of the operation of said XY driving mechanism 53 and the arm driving device.

In this manner, in said wire bonder, the mechanism inherently provided in said wire bonder for bonding work, namely the above-mentioned XY driving mechanism 53, which provides two-dimensional coordinates to the above-mentioned bonding arm (comprised of horn 61 and holding frame 62), and the above-mentioned arm driving device, which operates said bonding arm by making it approach and withdraw from the bonding object in the form of lead frame L/F, is used as a portion of the above-mentioned tool replacement device, and together with bringing the above-mentioned bonding arm to the above-mentioned tool holding device 91 located at the position where new capillaries 64 are stored by utilizing the action of said mechanism, used capillary 64 is contained in said tool holding device 91, which also performs coupling of new capillary 64. Thus, since the device that performs transfer of capillary 64 uses an existing device, as described above, a tool replacement device is composed by only adding a tool holding device 91, which stores capillaries 64, and fastening member tightening and removal device 92, which tightens and removes bolt 87. For this reason, the overall structure of the wire bonder is simplified and costs are reduced.

Incidentally, although XY driving mechanism 53 and the above-mentioned arm driving device need not be used in this manner, in such cases, a tool transfer device (not shown) must be equipped for the above-mentioned tool replacement device to perform the work of removing the used capillary from the above-mentioned bonding arm (horn 61 of) that has stopped at an arbitrary position, bringing it to the above-mentioned tool holding device 91, placing it in said tool holding device 91, transferring a new capillary and coupling it to horn 61. As a result, the constitution becomes complex and large.

Figure 17:
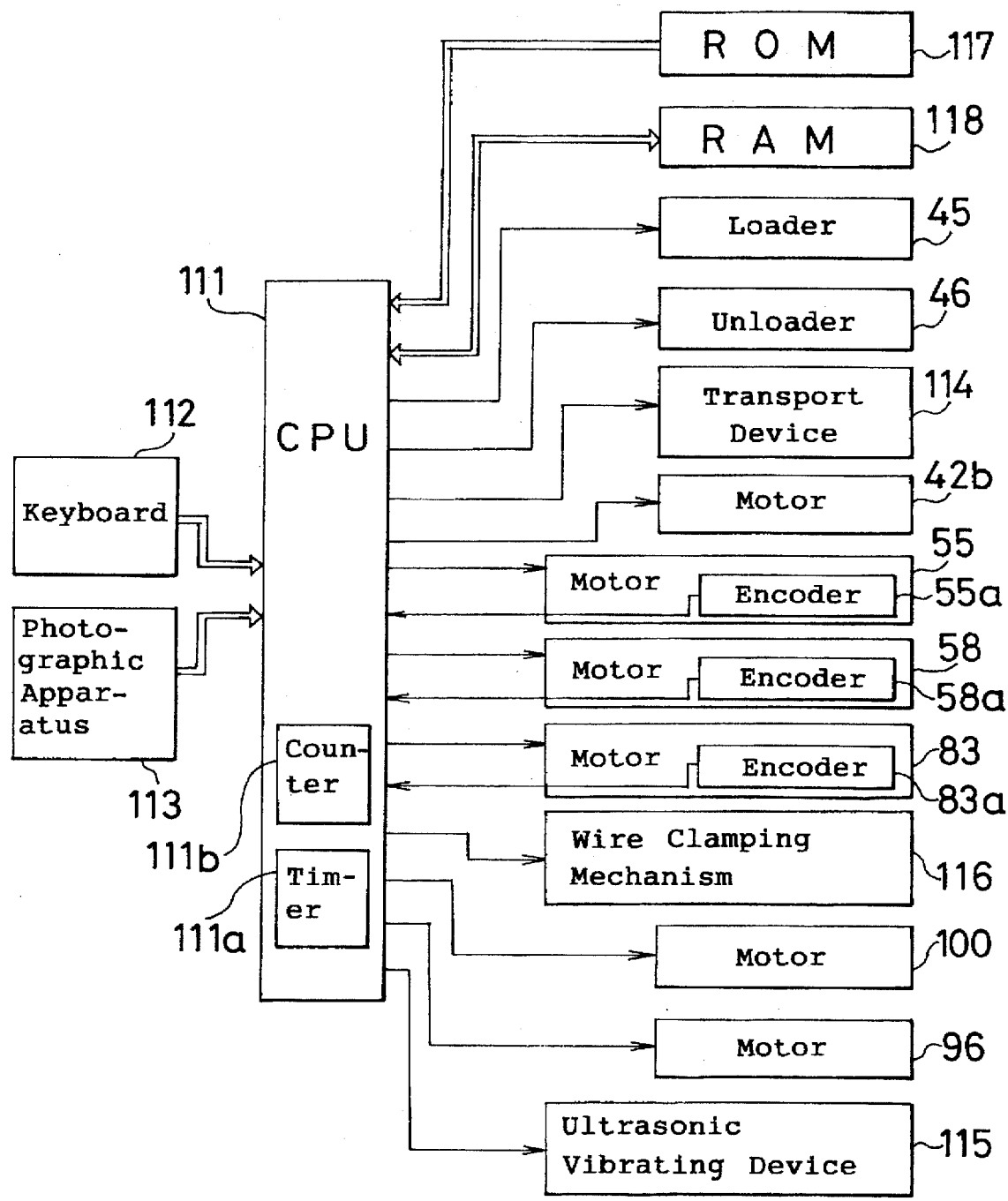
FIG. 17 is a block diagram showing the control system of the wire bonder shown in FIG. 5.

FIG. 17 indicates a block drawing showing the control system of said wire bonder. As shown in said drawing, control portion (referred to as the CPU) 111, which is composed of a microcomputer and so forth and governs the operation and control of said wire bonder, receives various signals emitted from keyboard 112 (actual keyboard not shown, indicated only in FIG. 17) and photographic apparatus 113 (installed on bonding head 51 shown in FIGS. 5 and 8, although the actual photographic apparatus is not shown, but rather only indicated in FIG. 117). Based on said signals, the above-mentioned CPU then operates the previously described transport device (which transports lead frames L/F, although the actual transport device is not shown), loader 45, unloader 46, motor 42b, motor 55, motor 58, motor 83, motor 100, motor 96, ultrasonic vibrating device 115 (of which only a portion, vibrator 85, is shown in FIG. 10) and wire clamping mechanism 116 (actual mechanism is only briefly indicated later) at the timing to be described later. In this case, CPU ill reads work procedure data entered in advance into ROM (Read Only Memory) 117, and then performs operation and control based on that data. In addition, as will be described later, required data is entered into RAM (Random Access Memory) 118 in the form of storage device where it is stored.

Next, the following provides an explanation of the operation of said wire bonder based on an example of a work procedure program entered into the above-mentioned ROM 117.

First, an explanation is provided starting from bonding work.

When an operation command signal is emitted by the operation of keyboard 112 shown in FIG. 17, CPU 111 (see FIG. 17) operates transport device 114 (see FIG. 17). As a result, the lead frame L/F at, for example, the lowest level of the plurality of lead frames L/F arranged inside magazine M on loader 45 (see FIG. 5) is taken out and carried in on bonding stage 32 (see FIG. 5). Next, the first IC chip 37 on said lead frame L/F is positioned at the bonding work position, namely below bonding head 51. At the same time, pushing device 42 shown in FIG. 5 is operated, and said first IC chip 37 and each of its peripheral leads are pushed and fixed to bonding stage 32. In this state, bonding device 35 (see FIG. 5), containing said bonding head 51 and XY driving mechanism 53, is operated and a first bonding point in the form of pad 37a on IC chip 37 and a second bonding point in the form of read 39 are connected by wire 40 as shown in FIG. 7.

Figure 18:
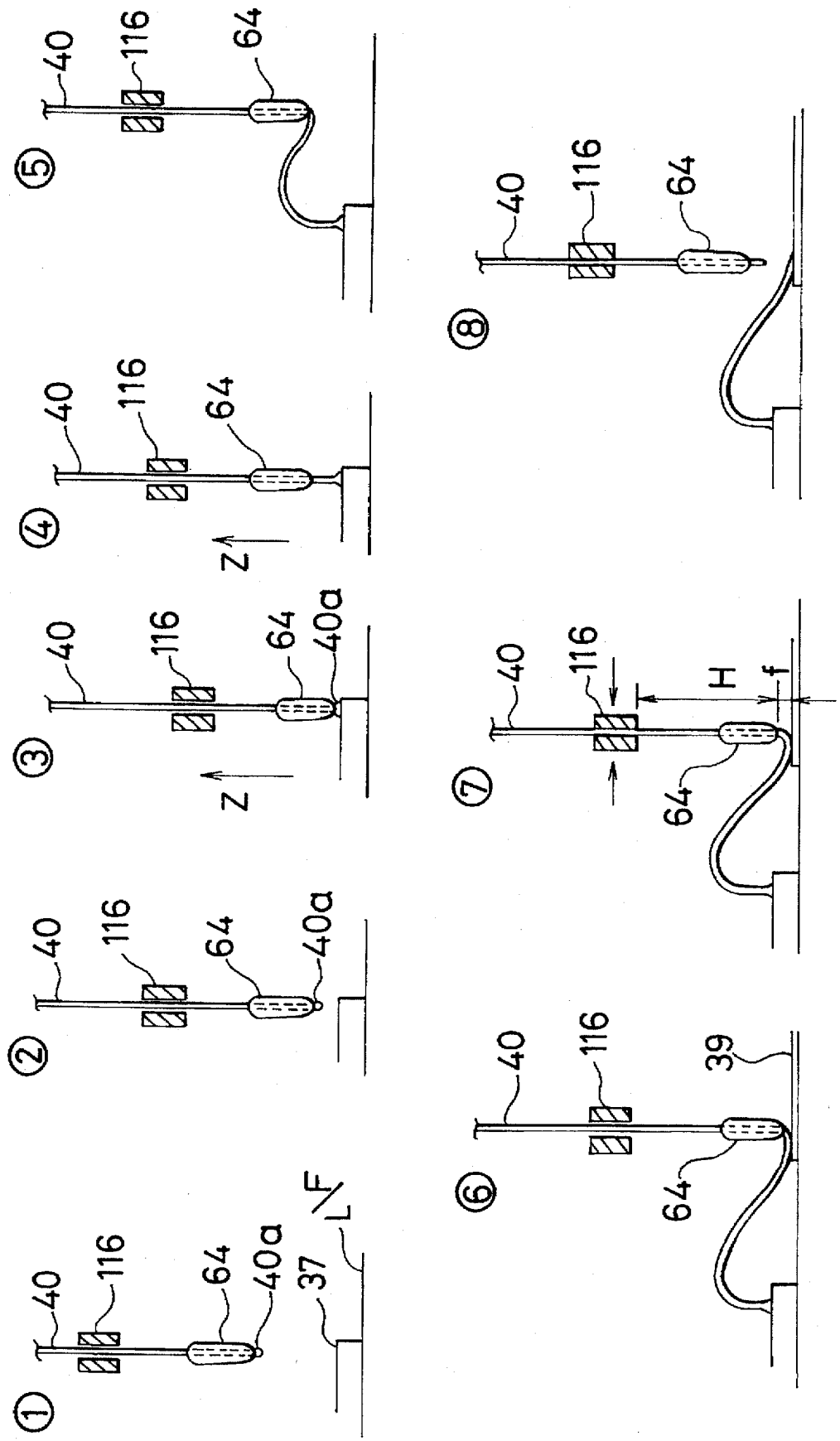
FIG. 18 is an explanatory diagram of the operation of the wire bonder shown in FIG. 5.

The following provides an explanation of this bonding process also using FIG. 18.

First, in the case of bonding to pad 37a on the above-mentioned IC chip 37, each of motors 55 and 58 equipped on the above-mentioned XY driving mechanism 53 are suitably operated based on information from photographic apparatus 113 (see FIG. 17) and so forth, and bonding head 51 moves two-dimensionally. As a result, capillary 64 mounted on the end of horn 61 contained by said bonding head 51 is positioned directly above the pad on which bonding is to be performed first of the large number of pads 37a (see FIG. 7) provided on the above-mentioned first IC chip 37. Furthermore, at this time, ball 40a is formed on the end of wire 40 inserted through said capillary 64.

After the above-mentioned operation, motor 83 shown in FIGS. 8 and 9 is operated resulting in rotation of cam 78. Accordingly, the bonding arm composed of the above-mentioned horn 61 and holding frame 62 (see FIG. 8) oscillates downward and capillary 64 lowers as shown in (1) through (3) of FIG. 18 to compress and crush ball 40a on the above-mentioned pad 37a to perform thermocompression bonding. At this time, excitation of capillary 64 is performed with the previously described ultrasonic vibrating device.

Furthermore, in this process, the above-mentioned bonding arm is lowered at high speed from steps (1) to (2), and lowered at low speed from steps (2) to (3). In addition, reference numeral 116 in the drawing indicates a wire clamping mechanism that clamps and releases wire 40. Said wire clamping mechanism 116 is in the open state during lowering of this bonding arm.

When connection to the first bonding point is completed, the above-mentioned bonding arm moves up and down, and XY driving mechanism 53 is operated resulting in movement of capillary 64 as shown in (4) through (6) of FIG. 18. Wire clamping mechanism then pulls out wire 40 in the open state in accordance with a prescribed loop control, and connection is performed to lead 39 in the form of the second bonding point.

After this connection, the bonding arm oscillates upward by a prescribed angle, and wire 40 is pulled out by a prescribed feed amount f as shown in (7) of FIG. 18. Wire clamping mechanism 116 then closes as shown in the drawing. In this state, wire 40 is cut as shown in (8) by a process in which the bonding arm is further oscillated upward. Next, a ball is formed using an electric torch (not shown) on the end of wire 40 protruding downward from capillary 64, and wire clamping mechanism 116 is set to the open state to return to the state of the above-mentioned (1). Bonding connection for a mutually corresponding set of pads and leads is thus completed by this series of process.

Continuing, the above-mentioned series of operations is repeated for each pad 37a of the plurality of pads provided on IC chip 37 and each lead arranged corresponding to said pads 37a to complete bonding connection relating to the first IC chip 37.

After bonding is completed, the previously described transport device 116 is operated, and the above-mentioned lead frame L/F is translated by the amount of one pitch of the layout pitch of each IC chip 37 to position the next IC chip 37 at the bonding work position. Bonding work is then performed on said IC chip. Bonding work is then sequentially continued in a similar manner until bonding connection for all IC chips 37 on lead frame L/F is completed.

When bonding work on a first lead frame L/F is completed as described above, that lead frame is contained in magazine M loaded onto unloader 46 (see FIG. 5) by operation of the above-mentioned transport device 116. Next, loader 45 (see FIG. 5) operates resulting in magazine M loaded on it being lowered by the amount of one pitch of the layout pitch of each lead frame L/F in said magazine. As a result, the second lead frame L/F contained in the level above the above-mentioned first lead frame L/F on which bonding has already been completed is positioned at the same level as bonding stage 32. The same operation as that for the above-mentioned first lead frame is performed for this second lead frame followed by bonding work after which said second lead frame is contained in magazine M on unloader 46. Continuing in the same manner, bonding work is continued by repeating the above-mentioned series of operations on all lead frames L/F in magazine M on loader 45.

Next, the following provides an explanation of replacement work of capillary 64 performed after the above-mentioned bonding work has been continued for a certain period of time.

Furthermore, in said wire bonder, this capillary replacement work is stipulated so as to be performed when the cumulative time of bonding work has reached a prescribed time after bonding work by said wire bonder has started following the previous replacement with a new capillary 64. Namely, since the degree of wear and so forth of capillary 64 accompanying continuation of the series of bonding work described above is proportional to the cumulative time bonding work has actually been performed, the amount of time at which the allowable degree of wear and so forth for maintaining a favorable bonding state is exceeded is determined based on test work conducted in advance. An amount of time before that time is reached is then set and this is used as the above-mentioned prescribed time. Thus, replacement work is performed when said prescribed time has elapsed. CPU 111 shown in FIG. 17 manages this time with timer 111a with which it is equipped. Thus, there is no occurrence of a delay in capillary replacement like that in the apparatus of the prior art in which this time management was performed manually, and as a result, occurrence of bonding defects can be prevented and yield can be improved.

Figure 19:
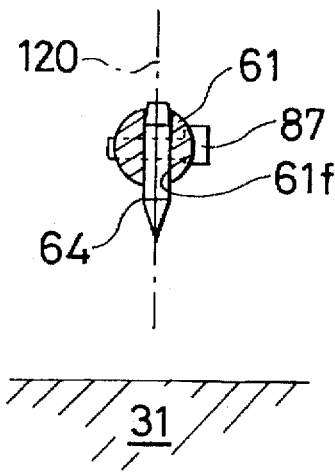
FIG. 19 is an explanatory diagram of the operation of the wire bonder shown in FIG. 5.
Figure 20:
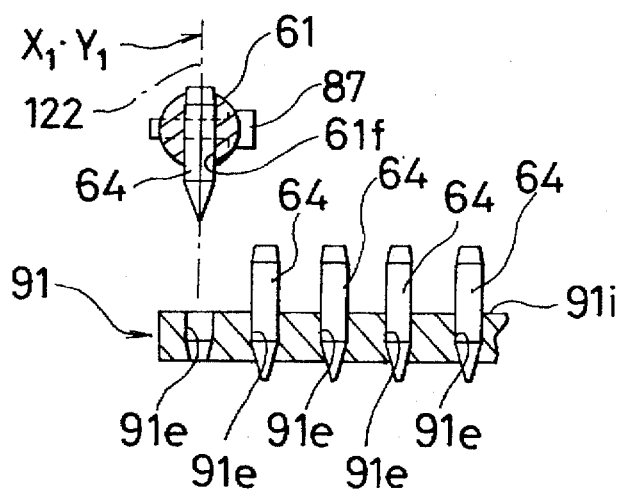
FIG. 20 is an explanatory diagram of the operation of the wire bonder shown in FIG. 5.

During replacement of capillary 64, the above-mentioned CPU 111 suitably operates motors 55 and 58 equipped on XY driving mechanism 53 (see FIG. 5) to move bonding head 51 two-dimensionally and bring used capillary 64 mounted on the end of horn 61 contained in said bonding head 51 to reference position 120 as shown in FIG. 19. This reference position 120 is set, for example, at the center position of each of the operating strokes of X table 54 (see FIG. 5) and Y table 57 based on the operation of the above-mentioned motors 55 and 58, and the reaching of this reference position 120 by capillary 64 is confirmed by coordinate data of XY driving mechanism 53. The above-mentioned motors 55 and 58 are again operated at which time said capillary 64 begins two-dimensional movement from said reference position 120 so that it is positioned directly above empty insertion hole 91e of the six insertion holes 91e (also see FIG. 13) formed for capillary insertion in tool holding device 91 as shown in FIG. 20 (indicated with arrow $X_1 \cdot Y_1$).

Figure 21:
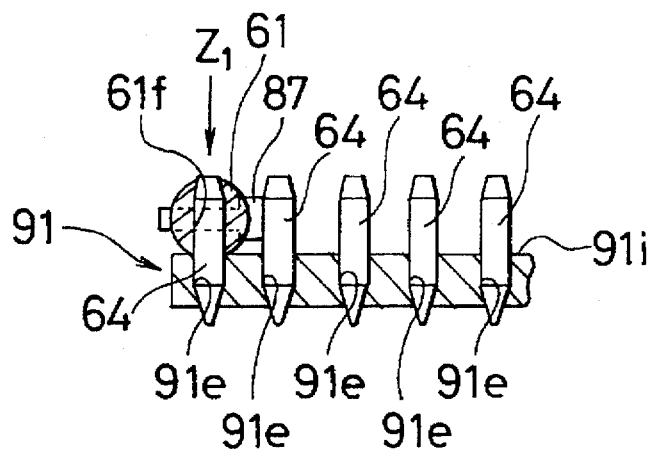
FIG. 21 is an explanatory diagram of the operation of the wire bonder shown in FIG. 5.
Figure 22:
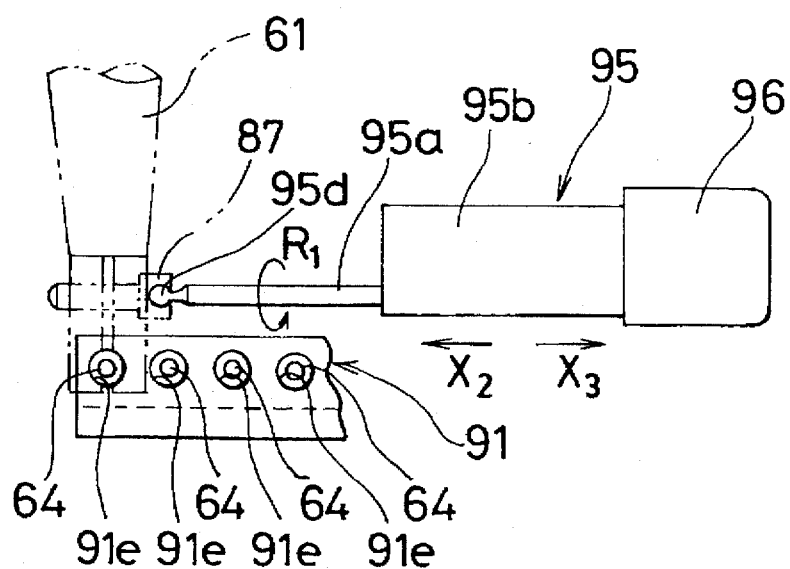
FIG. 22 is an explanatory diagram of the operation of the wire bonder shown in FIG. 5.

Next, motor 83 shown in FIGS. 8 and 9 is operated resulting in rotation of cam 78. The bonding arm composed of the above-mentioned horn 61 and holding frame 62 (see FIG. 8) then oscillates downward and said capillary 64 is inserted into the above-mentioned empty insertion hole 91e as shown in FIG. 21 (indicated with arrow $Z_1$). In this state, motor 100 equipped on fastening member tightening and removal device 92 shown in FIG. 13 is operated. As a result, moving table 99 provided on said fastening member tightening and removal device 92 moves forward to bring torque wrench 95 on said moving table 99 close to bolt 87 as shown in FIG. 22 (indicated with arrow $X_2$). Next, end fitting portion 95d of hexagonal tip 95a equipped on said torque wrench 95 fits into hexagonal socket 87a (see FIG. 12) formed in the head portion of bolt 87. Furthermore, at this time, if torque wrench 95 is operated with the operation of motor 96, fitting portion 95d of hexagonal tip 95a fits smoothly into said hexagonal socket 87a.

After the above-mentioned operations have been performed, the above-mentioned bolt 87 is loosened by the operation of torque wrench 95 (indicated with arrow $R_1$ in FIG. 22) based on the operation of motor 96 to release the tightened state. As a result, the tightened state of capillary 64 to horn 61 is correspondingly released. When this is done, motor 100 shown in FIG. 13 is operated in reverse, and torque wrench 95 moves back as shown in FIG. 22 (indicated with arrow $X_3$) to separate from said bolt 87. Furthermore, the engaging of torque wrench 95 with bolt 87 and conversely, its release are detected with a sensor and so forth not shown.

Figure 23:
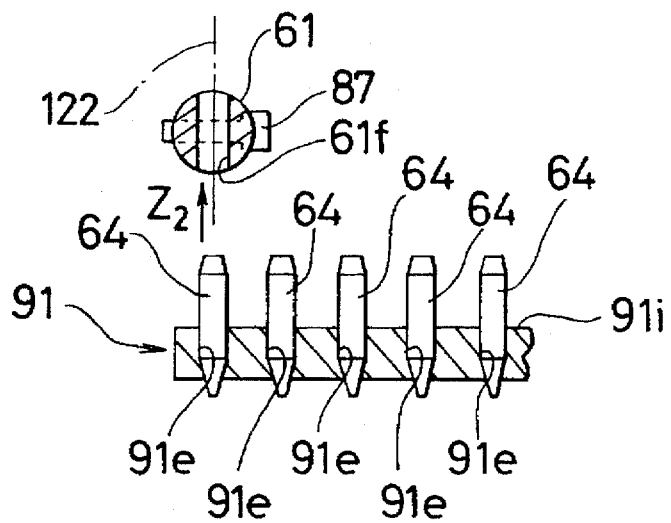
FIG. 23 is an explanatory diagram of the operation of the wire bonder shown in FIG. 5.

When separation of torque wrench 95 from bolt 87 has been confirmed, motor 83 shown in FIGS. 8 and 9 is operated causing horn 61 to rise as shown in FIG. 23 (indicated with arrow $Z_2$) and used capillary 64 to remain in tool holding device 91. Here, at least upper portion 91a of said tool holding device 91 in which insertion holes 91e are formed for insertion of each capillary 64 is formed from a soft material having a relatively large coefficient of friction such as plastic. Each insertion hole 91e is formed to have a diameter that is slightly smaller than the outer diameter of capillary 64 which is inserted into it. Thus, each capillary 64 that is inserted into said insertion hole 91e is subjected to pressure based on the elastic deformation of the inside wall of said insertion hole 91e, and since the frictional force that is produced between the two is relatively large, capillary 64 will not come out of said insertion hole 91e provided a considerably large force is not applied. For this reason, used capillary 64 reliably remains in tool holding device 91 when horn 61 rises as described above.

Figure 24:
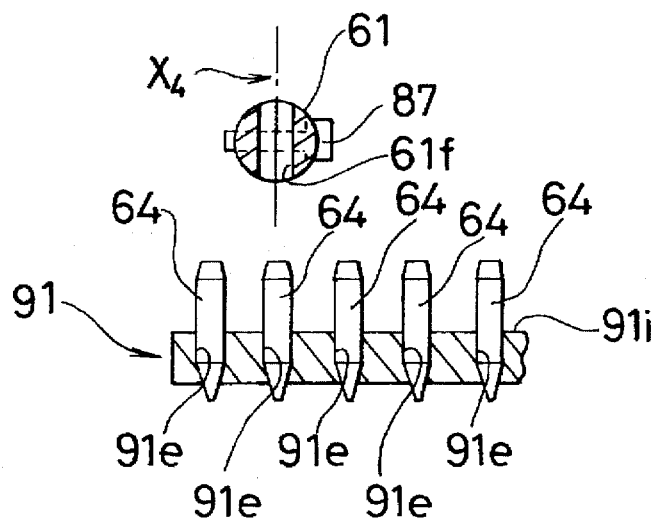
FIG. 24 is an explanatory diagram of the operation of the wire bonder shown in FIG. 5.
Figure 25:
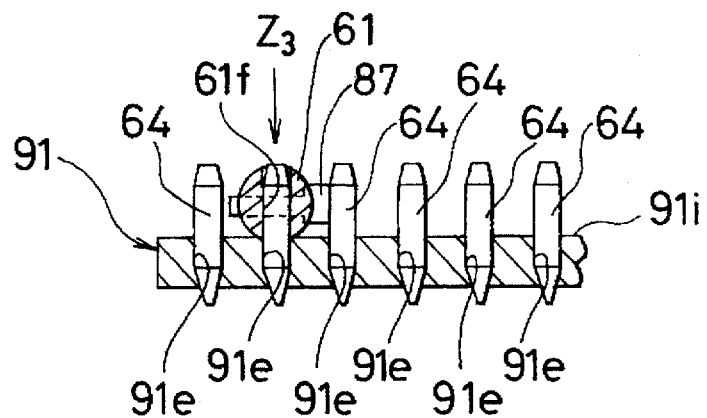
FIG. 25 is an explanatory diagram of the operation of the wire bonder shown in FIG. 5.

Continuing, the above-mentioned XY driving mechanism 53 is operated, and as shown in FIG. 24, the above-mentioned horn 61 is moved and positioned so that insertion hole 61f, formed in it for capillary insertion, is directly above first new capillary 64 (indicated with arrow $X_4$). Once it has been confirmed that said insertion hole 61f is positioned directly above said capillary 64, the above-mentioned bonding arm containing said horn 61 oscillates downward (indicated with arrow $Z_3$), and insertion hole 61f of horn 61 fits over said capillary 64 as shown in FIG. 25.

During this fitting, the attachment position of capillary 64 with respect to the bonding arm (containing horn 61), and more specifically, the position of attachment in the axial direction of capillary 64, is set automatically. Namely, when horn 61 is oscillated downward so as to fit its insertion hole 61f onto said capillary 64, as shown in FIG. 25, its end makes contact with upper surface 91i of tool holding device 91 (also shown in FIG. 14) and then stops at that point. At this time, both said capillary 64 and horn 61 are engaged with said tool holding device 91, and if the relative positions between the height of capillary 64 when inserted and held in insertion hole 91e of tool holding device 91 and this upper surface 91i are accurately set in advance, the amount capillary 64 is inserted into insertion hole 61f of horn 61 is self-determined, resulting in capillary 64 being positioned at a prescribed insertion position. Furthermore, as is clear from FIG. 14, the holding height of capillary 64 with respect to tool holding device 91 is determined by the capillary end portion formed into a roughly conical shape tightly engaging with tapered surface 91g formed in said tool holding device 91.

Namely, the above-mentioned tool holding device 91 acts as a jig that sets the relative positions of both horn 61 and capillary 64 by engaging with both said horn 61 and capillary 64. However, a jig that performs this action may also be provided separately near said tool holding device 91 instead of using tool holding device 91 for holding capillaries 64 in a row as a jig in this manner.

On the other hand, although downward oscillation of the above-mentioned horn 61 is stopped the moment it engages with upper surface 91i of tool holding device 91, this stopping is based on a detection signal emitted by a detection device having the constitution described below.

Namely, motor 83, provided to as to raise and lower the bonding arm containing the above-mentioned horn 61 (see FIGS. 8 and 9), is comprised of a pulse motor in this case, and as shown in FIG. 17, is equipped with encoder 83a that emits pulse signals corresponding to its amount of rotation. When the end of horn 61 engages with upper surface 91i of tool holding device 91 as described above, the above-mentioned motor 83 stops since said horn 61 is unable to further oscillate downward beyond that point, and a pulse signal is no longer obtained from said encoder 83a. CPU 111 confirms completion of engagement as a result of being in this state, and interrupts power supply to motor 83. As a result of combining the action of this detection device of said constitution and the above-mentioned action of tool holding device 91 as a jig, the attachment position of new capillary 64 with respect to (horn 81 of) the bonding arm is set automatically. This detection device and jig in the form of tool holding device 91 are generically referred to as a tool attachment position setting device. Furthermore, this detection device is also used to confirm the state shown in FIG. 21, namely that used capillary 64 has been inserted into insertion hole 91e of tool holding device 91. Namely, this is based on the bonding arm being unable to further oscillate downward when used capillary 64 is completely inserted into said insertion hole 91e.

Although the above-mentioned attachment position of new capillary 64 with respect to the bonding arm is important in consideration of being able to perform highly precise bonding work, as a result of automating the setting of this attachment position in the manner described above, the series of replacement work consisting of removal of used capillary 64 to installation of a new capillary is performed rapidly, while attachment is performed with high precision.

In the wire bonder of the present invention, a device consisting of a jig, which engages with (horn 61 of) the bonding arm and capillary 64 to set the relative positions of both as described above, and a detection device for detecting that said bonding arm has engaged with said jig, is employed as a specific example of the above-mentioned tool attachment position setting device. According to this constitution, with respect to said detection device, if the arm driving device that operates the bonding arm has a driving force generation device in the form of a pulse motor in the manner of, for example, the present embodiment, detection is performed by controlling said pulse motor based on further operation being impossible as a result of the bonding arm engaging with the above-mentioned jig, thus enabling the detection device to be composed based on software. Thus, the only component that should be provided as a member for setting of the tool attachment position is the above-mentioned jig, thus making the wire bonder of the present invention useful in terms of reducing costs and effectively utilizing the space on the apparatus frame.

Figure 26:
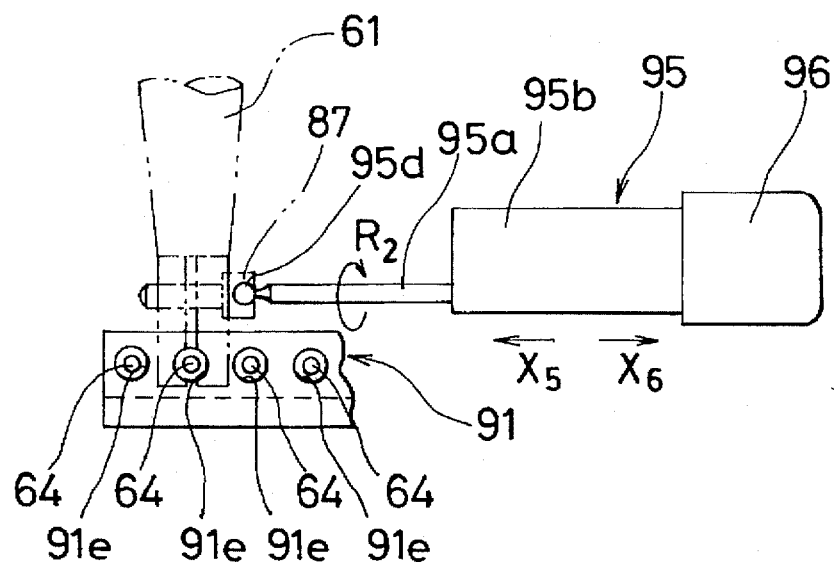
FIG. 26 is an explanatory diagram of the operation of the wire bonder shown in FIG. 5.

At this point, once coupling of horn 61 to new capillary 64 (and more specifically, fitting of insertion hole 61f of said horn 61 onto said capillary 64) is completed in the manner described above, motor 100 equipped on fastening member tightening and removal device 92 shown in FIG. 13 is again operated. As a result, moving table 99 shown in said drawing moves forward, and torque wrench 95 on said moving table 99 approaches bolt 87 as shown in FIG. 26 (indicated with arrow $X_5$). Next, end fitting portion 95d of hexagonal tip 95a equipped on said torque wrench 95 fits into hexagonal socket 87a formed in the head portion of bolt 87 (see FIG. 12). Furthermore, at this time as well, if torque wrench 95 is operated with the operation of motor 96, fitting portion 95d of hexagonal tip 95a fits smoothly into said hexagonal socket 87a.

Following the above-mentioned operations, the above-mentioned bolt 87 is tightened by the operation of torque wrench 95 based on the operation of motor 96 (indicated with arrow $R_2$ in FIG. 26). As a result, new capillary 64 coupled to horn 61 is fastened to said horn 61. When this is done, motor 100 shown in FIG. 13 is operated in reverse causing torque wrench 95 to move back as shown in FIG. 26 (indicated with arrow $X_6$) and separate from said bolt 87.

Figure 27:
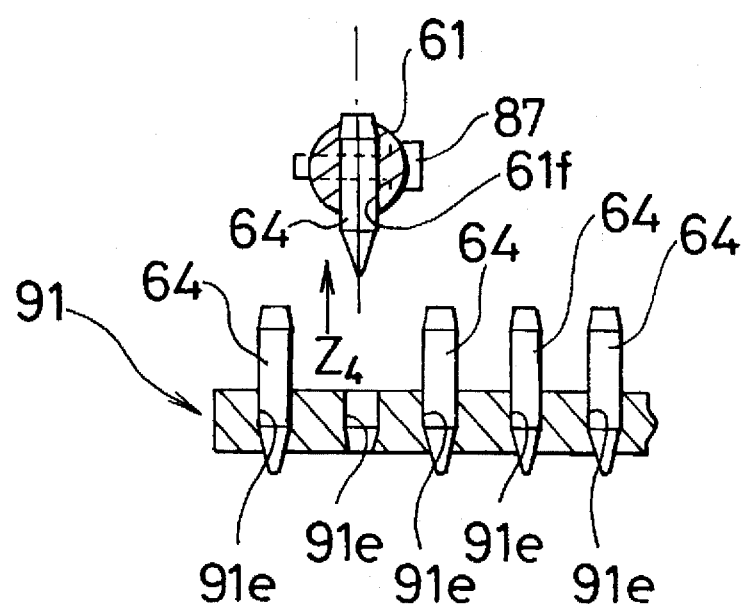
FIG. 27 is an explanatory diagram of the operation of the wire bonder shown in FIG. 5.

When it is confirmed that torque wrench 95 has separated from bolt 87, motor 83 shown in FIGS. 8 and 9 is operated, and horn 61 to which new capillary 64 is mounted rises (indicated with arrow $Z_4$) as shown in FIG. 27, and is then provided for bonding work in the same manner as previously described.

However, in said wire bonder, a storage device in the form of RAM 118 (see FIG. 17) can also be used as another specific example of the above-mentioned tool attachment position setting device (more specifically, to the position at which capillary 64 is attached in the axial direction) for automatically setting the attachment position of capillary 64 with respect to (horn 61 of) the bonding arm.

Namely, distance data from the reference position at which the bonding arm including the above-mentioned horn 61 is set in advance (to be described later) to the desired position at which the bonding arm starts to oscillate downward by the operation of the arm driving device (composed of motor 83 and so forth as previously described) and approach the above-mentioned tool holding device 91, namely the position at which a new capillary 64 stored in said tool holding device 91 couples with (insertion hole 61f of horn 61 of) said bonding arm so as to be at the proper attachment position, is determined based on test operations performed in advance, and said distance data is stored (teaching) in the above-mentioned RAM 118. In this case, the reference position of the bonding arm is set, for example, at the oscillation limit position in the upward direction, and the reaching of that oscillation limit position by the bonding arm is detected by emitting a detection signal from a sensor not shown, or interrupting pulse signals from encoder 83a (see FIG. 17) of motor (pulse motor) 83 based on providing a stopper and so forth that restricts the rising of the bonding arm and that bonding arm being unable to rise further in the same manner as previously described. With respect to the above-mentioned distance data, the number of pulses emitted from said encoder 83a from the time the bonding arm starts to operate from the above-mentioned reference position until it reaches the desired position close to tool holding device 91 is counted using counter 111b (see FIG. 17) to determine that number of pulses. However, a jig and so forth is used at this time only to determine the desired attachment position during teaching in this manner.

According to a constitution in which setting of the capillary attachment position is performed completely with software by performing teaching in the manner described above, a jig need only be used during the initial performing teaching, and since this jig can be removed as a result of not being required after this teaching, actual members for setting capillary attachment distance are not present in any way on the apparatus frame 31 (see FIG. 5). Accordingly, together with the space of said apparatus frame 31 being able to be used even more effectively, there is no increase in the overall cost of the apparatus.

However, the above-mentioned teaching is also performed during two-dimensional positioning with respect to tool holding device 91 of the bonding arm performed to replace capillary 64. More specifically, this teaching relates to the movement of (horn 61 of) the bonding arm from reference position 120 shown in FIG. 19 to the position shown in FIG. 20, namely the position corresponding to empty insertion hole 91e as the containment site of used capillary 64. In addition, this teaching also relates to the movement of the bonding arm from the position shown in FIG. 23 (the same position as that shown in FIG. 20) to the position shown in FIG. 24, namely the position corresponding to the containment site of first new capillary 64. The following provides an explanation of those teaching operations.

First, the distance data over which the above-mentioned bonding arm containing horn 61 moves from the above-mentioned preset reference position 120 to the desired position at which said bonding arm begins to move two-dimensionally by the operation of XY driving mechanism 53 with respect to the above-mentioned tool holding device 91, namely the position at which used capillary 64 mounted to said horn 61 is directly above empty insertion hole 91e of said tool holding device 91 (shown in FIG. 20), is determined by performing test operations in advance, and said distance data is stored (teaching) in RAM 118 (see FIG. 17). In this case, said distance data is determined in the manner described below.

Namely, the two motors 55 and 58 equipped on the above-mentioned XY driving mechanism 53 are both composed of pulse motors, and as shown in FIG. 17, are equipped with encoders 55a and 58a that emit pulse signals corresponding to the amount of rotation of each. The above-mentioned distance data can then be determined by counting the number of pulses respectively emitted from each said encoders 55a and 58a from the time the bonding arm starts to operate from the above-mentioned reference position 120 until it reaches the above-mentioned desired position with respect to tool holding device 91 using counter 111b (see FIG. 17).

Next, after setting the above-mentioned desired position, namely the position shown in FIGS. 20 and 23, as second reference position 122, the distance data from the time the bonding arm begins to move two-dimensionally by the operation of the above-mentioned motors 55 and 58 from this second reference position 122 until it reaches the position of FIG. 24, namely the position where the number of pulses are counted, is stored (teaching) in the above-mentioned RAM 118. From that point on, teaching is performed similarly for the distance data for the bonding arm moving to the containment sites of the four remaining new capillaries 64. In the present embodiment, however, movement to the position indicated in FIG. 24 is uniaxial movement (indicated with arrow $X_4$) performed only by the operation of motor 55.

Once teaching has been performed in the manner described above, position setting is performed immediately by recalling the above-mentioned data stored in RAM 118.

Consequently, there is good reproducibility, and capillary replacement work can be performed both accurately and quickly.

In the wire bonder of the present invention, the following constitution is employed so that the capillary replacement work performed in the manner described above proceeds more smoothly.

First, with respect to horn 61 that forms a portion of the above-mentioned bonding arm, as shown in FIG. 12, tapered surface 61j for guiding insertion of capillary 64 is formed on the opening of the capillary insertion side, namely in the lower opening, of insertion hole 61f formed in said horn 61 into which capillary 64 is to be inserted. In addition, as shown in FIGS. 11 and 12, tapered surface 64c for guiding insertion into said insertion hole 61f is formed on the end of the insertion side with respect to said insertion hole 61f, namely on the upper end, of capillary 64. As a result of employing this constitution, mutual insertion of horn 61 and capillary 64 is performed both smoothly and reliably at all times without being obstructed, and thus there is no occurrence of work delays based on this insertion not being performed. However, at least one of either tapered surface 61j or 64c of horn 61 and capillary 64 should be formed.

Next, with respect to the previously described tool holding device 91, as shown in FIG. 14, tapered surface 91i for guiding insertion of capillary 64 is formed in the opening on the capillary insertion side, namely the upper opening, of insertion hole 91e formed in said tool holding device 91 into which capillary 64 is to be inserted. Accordingly, insertion of capillary 64 into insertion hole 91e of said tool holding device 91 is performed both smoothly and reliably at all times without being obstructed, and there is no occurrence of work delays based on this insertion not being performed, thus being effective in terms of improving the efficiency of wire bonding work.

Figure 28:
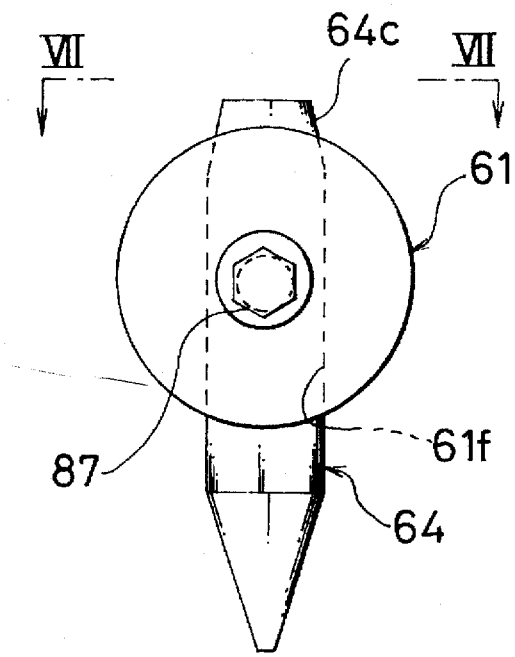
FIG. 28 is a front view showing a variation of the horn and capillary which are essential portions of the bonding head shown in FIG. 8.
Figure 29:
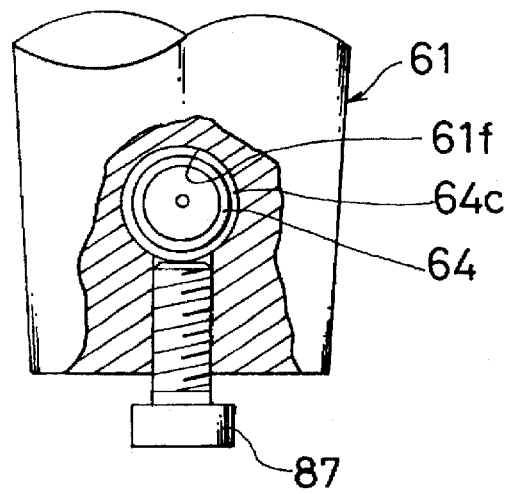
FIG. 29 is an overhead view, including a partial cross-section, taken along arrows VII—VII relating to FIG. 28.

Furthermore, although a constitution is indicated in the present embodiment in which slit 61g extending in the axial direction to horn 61 is provided and fastened using bolt 87 from the side of horn 61, the formation of this slit and the direction of fastening and so forth are not limited to this, but rather the present invention can naturally also be applied with respect to various other constitutions such as, for example, those shown in FIGS. 28 and 29. In the case of the constitutions shown in FIGS. 28 and 29, only insertion hole 61f on the end of horn 61 into which capillary 64 is inserted, and a slit is not formed. Bolt 87 is then screwed in the axial direction of horn 61.

In addition, although bolt 87 with hexagonal socket is used for the fastening device for fastening capillary 64 to horn 61 in the present embodiment, various other types of fastening devices can also be used.

As has been explained above, in the wire bonder according to the present invention, a tool replacement device is provided that together with removing a used bonding tool mounted on the bonding arm, also installs a new bonding tool.

As a result of employing a constitution in which bonding tool replacement work is automated, the worker need only perform the simple work of replenishing new, unused bonding tools in the above-mentioned tool replacement device and collecting used bonding tools at relatively long intervals, and tool replacement does not require any expertise whatsoever and is not bothersome. In addition, together with enabling replacement to be performed much faster than manual replacement work by an operator, time management of the degree of wear of the bonding tool and so forth is more reliable as a result of being performed by the control portion of the apparatus, thus achieving improved efficiency and yield of bonding work.

In addition, in the wire bonder according to the present invention, the above-mentioned bonding tool is fastened to the above-mentioned bonding arm by a fastening member such as a bolt and so forth. The above-mentioned tool replacement device has a tool holding device, which holds a plurality of new bonding tools, arranged within the range of two-dimensional movement of the above-mentioned bonding arm, in a row in a prescribed direction and mutually parallel with the bonding object (lead frame in the embodiment) in the direction of approach and withdrawal of the bonding tools, and a fastening member tightening and removal device provided near said tool holding device that performs tightening and removal of the above-mentioned fastening member. In addition, said tool replacement device contains used bonding tools for said tool holding device and couples new bonding tools to said bonding arm by positioning and operating the bonding arm based on the operation of a positioning device and arm driving device.

Namely, the mechanism inherently provided in said wire bonder for bonding work, namely the above-mentioned positioning device, which provides two-dimensional coordinates to the bonding arm, and the above-mentioned arm driving device, which operates said bonding arm by making it approach and withdraw from the bonding object, is used as a portion of the above-mentioned tool replacement device, and together with bringing the above-mentioned bonding arm to the above-mentioned tool holding device located at the position where new bonding tools are stored by utilizing the action of said mechanism, used bonding tools are contained in said tool holding device which also performs coupling of new bonding tools. Thus, since the device that performs transfer of the bonding tool uses an existing device, previously described a tool replacement device is composed by only adding a tool holding device, which stores bonding tools, and a fastening member tightening and removal device, which tightens and removes a fastening member. For this reason, the overall structure of the wire bonder is simplified and costs are reduced. Incidentally, although the above-mentioned positioning device and arm driving device need not be used in this manner, in such cases, a tool transfer device must be equipped for the above-mentioned tool replacement device to perform the work of removing used bonding tools from the bonding arm that has stopped at an arbitrary position, bringing it to the above-mentioned tool holding device, placing it in said tool holding device, transferring a new bonding tool and coupling it to the bonding arm.

Next, in the wire bonder according to the present invention, distance data during the time the above-mentioned bonding arm starts to move by operation of the above-mentioned positioning device from a preset reference position to a position corresponding to each of the contained sites of new bonding tools in the above-mentioned tool holding device is determined, and said distance data is then stored in a storage device (RAM in the embodiment). Namely, so-called teaching is performed, and after this teaching has been performed. Since position setting is performed immediately by recalling this stored data, reproducibility is good and bonding tool replacement work can be performed both accurately and quickly.

In addition, in the wire bonder according to the present invention, after the cumulative time of bonding work of the apparatus reaches a prescribed time after a new bonding tool has been installed in the bonding arm, bonding tool replacement work is performed with the above-mentioned tool replacement device. Namely, since time management is performed by a control portion of the apparatus itself so as to perform bonding tool replacement prior to the degree of wear and so forth of the bonding tool accompanying bonding work exceeding an allowable limit, the occurrence of bonding defects, like those in the apparatus of the prior art in which this time management is performed manually, can be prevented and yield can be improved.

Moreover, in the wire bonder according to the present invention, a device having a tool (torque wrench in the embodiment) for tightening and removing said fastening member such as a bolt by engaging with said fastening member, a tool driving device (motor in the embodiment) that operates said tool so as to perform tightening and removal with said tool, and a movement device (uniaxial driving mechanism in the embodiment) that holds said tool and tool driving device and moves between the positions where said tool engages and separates from above-mentioned fastening member, is employed as a specific example of the above-mentioned fastening member tightening and removal device. Since the constitution of this type of fastening member tightening and removal device is relatively simple, in addition to costs being able to be held to a low level, since only a small amount of space is occupied, wire bonder can be easily incorporated without changing the layout positions and so forth of the various mechanisms already provided for bonding work.

In addition, in the wire bonder according to the present invention, the above-mentioned tool replacement device has a tool attachment position setting device that sets the attachment position of the bonding tool with respect to the bonding arm. Although the attachment position of the bonding tool with respect to the bonding arm is important in terms of performing highly precise bonding work, as a result of automating this setting of the attachment position in this manner, the series of replacement work from the removal of the used bonding tool to installation of a new bonding tool can be performed rapidly and attachment is performed with high precision.

Also, in the wire bonder according to the present invention, a device consisting of a jig, which engages with the bonding arm and bonding tool to set the relative positions of both, and a detection device for detecting that said bonding arm has engaged with said jig, is employed as a specific example of the above-mentioned tool attachment position setting device. According to this constitution, with respect to said detection device, if the arm driving device that operates the bonding arm has a driving force generation source in the form of a pulse motor in the manner of, for example, the present embodiment, detection is performed by interrupting the emission of pulses from said pulse motor based on further operation being impossible as a result of the bonding arm engaging with the above-mentioned jig, thus enabling the detection device to be composed based on software. Thus, the only component that should be provided as a member for setting of the tool attachment position is the above-mentioned jig, thus making the wire bonder of the present invention useful in terms of reducing costs and effectively utilizing the space on the apparatus frame.

On the other hand, in the wire bonder according to the present invention, a storage device such as RAM (Random Access Memory) installed in the wire bonder is used as another specific example of the above-mentioned tool attachment position setting device. Namely, distance data from the reference position at which the bonding arm is set in advance to the desired position at which the bonding arm starts to operate by the operation of the arm driving device and approach the above-mentioned tool holding device, namely the position at which a bonding tool stored in said tool holding device couples with the bonding arm so as to be at the proper attachment position, is determined, and said distance data is stored (taught) in the above-mentioned storage device. According to this type of constitution in which setting of the tool attachment position is performed completely with software by performing teaching in the manner described above, a jig needs only be used during the initial teaching, and since this jig can be removed as a result of not being required after this teaching, actual members for setting tool attachment position are not present in any way on the apparatus frame. Accordingly, together with the space of the apparatus frame being able to be used even more effectively, there is no increase in the overall cost of the apparatus.

In addition, in the wire bonder according to the present invention, the portion where the bonding tool is coupled to the above-mentioned bonding arm forms an insertion hole in which said bonding tool is inserted, and a tapered surface for guiding of mutual insertion is formed in either the opening on the tool insertion side of said insertion hole or on the end of the insertion side of said bonding tool. As a result, mutual insertion of the bonding arm and bonding tool is performed both smoothly and reliably at all times without being obstructed, and thus there is no occurrence of work delays based on this insertion not being performed.

In addition, in the wire bonder according to the present invention, the holding portion provided in the above-mentioned tool holding device to hold the above-mentioned bonding tool forms an insertion hole in which said bonding tool is inserted, and a tapered surface that guides the insertion of said bonding tool is formed in the opening on the tool insertion side of said insertion hole. Accordingly, insertion of the bonding tool into the insertion hole of said tool holding device is performed both smoothly and reliably at all times without being obstructed, and thus there is no occurrence of work delays based on this insertion not being performed, which is effective in terms of improving the efficiency of wire bonding work.

Moreover, in the wire bonder according to the present invention, the above-mentioned fastening member tightening and removal device is equipped with a fastening force setting device (torque setting portion of the torque wrench in the embodiment) for setting fastening force at a constant level. As a result, fastened force of the bonding tools that are sequentially replaced also remains constant, and in the case of applying ultrasonic vibrations to said bonding tool by an ultrasonic vibrating device, the transmission efficiency of the vibrations is uniform regardless of which bonding tool is used, thus enabling bonding using ultrasonic energy to be performed reliably at all times without the occurrence of bonding defects.

In addition, in wire bonder according to the present invention has an ultrasonic vibrating device that vibrates the bonding tool by transmitting ultrasonic vibrations to said bonding tool through the above-mentioned bonding arm. Although wear of the end of the bonding tool accompanying bonding work occurs due to the bonding tool pushing on the ball formed on the end of the wire, the proportion of wear resulting from the action of friction becomes large as a result of applying ultrasonic vibrations in this manner. Thus, the above-mentioned effects are demonstrated particularly remarkably in wire bonders equipped with said ultrasonic vibrating device.

Next, in the bonding arm according to the present invention, the portion of said bonding arm that is coupled with a bonding tool forms an insertion hole into which said bonding tool is inserted, and a tapered surface that guides insertion of said bonding tool is formed in the opening on the tool insertion side of said insertion hole. Accordingly, when the bonding tool is inserted into said insertion hole, the bonding tool is guided both smoothly and reliably by said tapered surface, thus eliminating apprehension over insertion being obstructed. Said bonding arm is suitable when used in the wire bonder described above in which bonding tool replacement work is automated, and contributes to achieving the effects to be demonstrated by said wire bonder.

On the other hand, in the bonding tool according to the present invention, a tapered surface that guides insertion is formed on the end of the side inserted into the insertion hole formed in the bonding arm. Thus, when inserted into said insertion hole, the bonding tool is guided smoothly and reliably by the action of said tapered surface, thus eliminating the risk of insertion being obstructed. This type of bonding tool is preferably used in a wire bonder in which bonding tool replacement work has been automated as previously described, and as a result of using this bonding tool, it contributes to achieving the effects to be demonstrated by said wire bonder.

What is claimed is:

1. A wire bonder comprising:
    a positioning device for positioning a bonding tool at a location corresponding to the bonding site of the bonding object by two-dimensionally moving a bonding arm on which said bonding tool is mounted;
    an arm driving device for driving said bonding arm to bring said bonding tool close to said bonding site; and
    a tool replacement device that maintains a stock of a plurality of new bonding tools, removes said bonding tool mounted on said bonding arm, and installs said new bonding tools.

2. A wire bonder as set forth in claim 1, further comprising:
    a fastening member for fastening said bonding tool to said bonding arm, wherein
    said tool replacement device comprises:
        a tool holding device, which holds said plurality of new bonding tools, arranged within the range of two-dimensional movement of said bonding arm, in a row in a prescribed direction and mutually parallel with the bonding object in the direction of approach and withdrawal of the bonding tools; and
        a fastening member tightening and removal device provided near said tool holding device that performs tightening and removal of said fastening member, contains used bonding tools for said tool holding device and couples new bonding tools to said bonding arm by positioning and operating said bonding arm based on the operation of said positioning device and said arm driving device.

3. A wire bonder as set forth in claim 2, further comprising a storage device for storing distance data, wherein said distance data represents a distance that the bonding arm moves by operation of said positioning device from a reference position to a position corresponding to each of the contained sites of bonding tools in said tool holding device.

4. A wire bonder as set forth in claim 1 wherein, when a cumulative time of bonding work of the apparatus reaches a prescribed time after said new bonding tool has been installed in said bonding arm, bonding tool replacement work is performed with said tool replacement device.

5. A wire bonder as set forth in claim 2 wherein said fastening member tightening and removal device comprises:
    a tool for tightening and removing said fastening member by engaging said fastening member;
    a tool driving device that operates said tool; and
    a movement device that holds said tool and tool driving device and moves said tool between the positions where said tool engages and separates from said fastening member.

6. A wire bonder as set forth in claim 1 wherein said tool replacement device comprises a tool attachment position setting device that sets the attachment position of said bonding tool with respect to the said bonding arm.

7. A wire bonder as set forth in claim 6 wherein said tool attachment position setting device comprises a jig, which engages with said bonding arm and bonding tool to set the relative positions of both, and a detection device for detecting that said bonding arm has engaged with said jig.

8. A wire bonder as set forth in claim 6 wherein said tool attachment position setting device comprises a storage device, said storage device storing distance data that represents a distance that the bonding arm moves by operation of said positioning device from a reference position at which said bonding arm starts to operate by the operation of said arm driving device to a desired position at which said bonding arm approaches said tool replacement device.

9. A wire bonder as set forth in claim 1 wherein said bonding arm includes an insertion hole in which said bonding tool is inserted, and wherein a tapered surface for guiding insertion of said bonding tool in the insertion hole is formed either in the insertion hole on a tool insertion side of the insertion hole, on the end of an insertion side of said bonding tool, or on both said tool insertion side of the insertion hole and the end of the insertion side of said bonding tool.

10. A wire bonder as set forth in claim 2 wherein said tool holding device includes an insertion hole in which said bonding tool is inserted, and wherein a tapered surface that guides the insertion of said bonding tool is formed in the insertion hole on a tool insertion side of the insertion hole.

11. A wire bonder as set forth in claim 2 wherein said fastening member tightening and removal device comprises a fastening force setting device for setting a fastening force at a constant level.

12. A wire bonder as set forth in claim 1 further comprising an ultrasonic vibrating device that vibrates said bonding tool by transmitting ultrasonic vibrations to said bonding tool through said bonding arm.

* * * * *